(12) United States Patent
Lius et al.

(10) Patent No.: US 11,756,981 B2
(45) Date of Patent: Sep. 12, 2023

(54) DISPLAY DEVICE

(71) Applicant: InnoLux Corporation, Miao-Li County (TW)

(72) Inventors: Chandra Lius, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 67 days.

(21) Appl. No.: 17/224,132

(22) Filed: Apr. 7, 2021

(65) Prior Publication Data

US 2021/0351227 A1 Nov. 11, 2021

(30) Foreign Application Priority Data

May 7, 2020 (CN) .......................... 202010379302.X

(51) Int. Cl.
*H01L 27/15* (2006.01)
(52) U.S. Cl.
CPC .................................. *H01L 27/156* (2013.01)
(58) Field of Classification Search
None
See application file for complete search history.

(56) References Cited

U.S. PATENT DOCUMENTS

| | | | |
|---|---|---|---|
| 11,108,019 B2 * | 8/2021 | Jin | ...................... H01L 51/5234 |
| 2020/0006403 A1 | 1/2020 | Chen | |
| 2020/0098318 A1 * | 3/2020 | Liu | ...................... G09G 3/3291 |
| 2020/0124927 A1 | 4/2020 | Kim | |
| 2020/0127061 A1 | 4/2020 | Zou | |

FOREIGN PATENT DOCUMENTS

| | | | | |
|---|---|---|---|---|
| CN | 108269840 A | * | 7/2018 | ......... H01L 27/3218 |
| CN | 108922900 A | | 11/2018 | |
| CN | 110444125 A | | 11/2019 | |
| CN | 110504289 A | | 11/2019 | |
| CN | 110767159 A | | 2/2020 | |
| EP | 3 660 905 A1 | | 6/2020 | |
| WO | 2019/019656 A1 | | 1/2019 | |
| WO | WO-2019080591 A1 | * | 5/2019 | |
| WO | WO-2019242351 A1 | * | 12/2019 | ............... G09F 9/00 |
| WO | 2020/259473 A1 | | 12/2020 | |

* cited by examiner

*Primary Examiner* — Robert K Carpenter
(74) *Attorney, Agent, or Firm* — Winston Hsu

(57) ABSTRACT

A display panel and a display device are provided by the present disclosure, wherein the display panel includes a pixel region having a plurality of pixels. The pixel region includes a first area and a second area, wherein the transmittance of the second area is greater than the transmittance of the first area. The second area has a coverage, and a width of the coverage is not less than 0.43 millimeters.

5 Claims, 10 Drawing Sheets

DISPLAY DEVICE

BACKGROUND OF THE DISCLOSURE

1. Field of the Disclosure

The present disclosure relates to a display device, and more particularly to a display device having an optical sensing module.

2. Description of the Prior Art

In current electronic devices, functional elements such as optical sensing module are disposed in the display region of the electronic device in order to increase the screen-to-body ratio, so as to reduce the size of the non-display region. However, because a portion of the electronic elements or the wires in the display region may affect the light receiving effect of the optical sensing module, to improve the light receiving effect of the optical sensing module has become an important issue in electronic industry.

SUMMARY OF THE DISCLOSURE

One of the purposes of the present disclosure is to provide a display device having an optical sensing module, wherein the pixels of the display device may include different designs to improve the light receiving effect of the optical sensing module.

In some embodiments, a display panel is provided by the present disclosure, wherein the display panel includes a pixel region having a plurality of pixels. The pixel region includes a first area and a second area. The transmittance of the second area is greater than the transmittance of the first area. The second area has a coverage with a width of not less than 0.43 millimeter (mm).

In some embodiments, a display device is provided, wherein the display device includes the display panel mentioned above and an optical sensing module. The optical sensing module is disposed corresponding to the second area of the pixel region of the display panel. The optical sensing module includes an aperture, wherein the aperture can accept lights through the second area. The aperture has a width, and the width of the aperture is less than the width of the coverage of the second area.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

Figure 1:
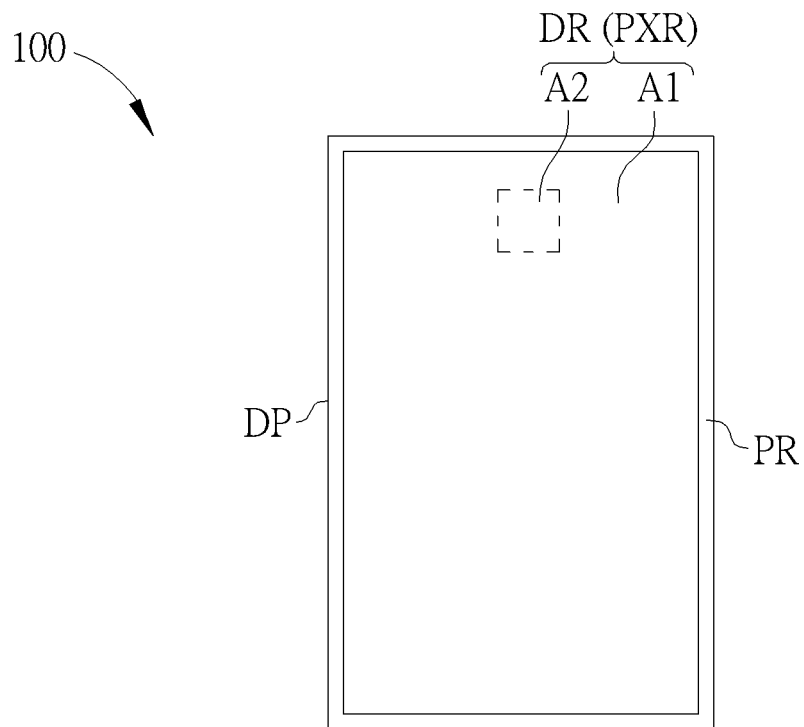
FIG. 1 schematically illustrates a top view of an electronic device according to a first embodiment of the present disclosure.

Referring to FIG. 1, FIG. 1 schematically illustrates a top view of an electronic device according to a first embodiment of the present disclosure. The electronic device of the present disclosure may for example include a display device, a light emitting device, a sensing device, a touch display device, a curved display device or a free shape display device, but not limited thereto. The electronic device may be a foldable electronic device or a flexible electronic device. The electronic device may for example include light emitting diode, fluorescence, phosphor, other suitable display mediums or the combinations of the above-mentioned materials, but not limited thereto. The light emitting diode may for example include organic light emitting diode (OLED), mini light emitting diode (mini LED), micro light emitting diode (micro LED), quantum dot light emitting diode (QLED or QDLED), other suitable materials or the combinations of the above-mentioned materials, but not limited thereto. The display device may for example include tiled display device, but not limited thereto. It should be noted that the electronic device may be the combinations of the above-mentioned devices, but not limited thereto. In addition, the appearance of the electronic device may be rectangular, circular, polygonal, a shape with curved edges or other suitable shapes. The electronic device may include peripheral systems such as driving system, control system, light source system and shelf system to support the display device or the tiled display device. It should be noted that the electronic device may be the combinations of the above-mentioned devices, but not limited thereto.

According to the present embodiment, the electronic device shown in FIG. 1 may include a display device 100, which may display static or dynamic images according to the demands and operations of users, but not limited thereto. The display device 100 may for example include notebook, common display, tiled display, vehicle display, touch display, television, surveillance camera, smart phone, tablet, light source module, lighting equipment or electronic devices applied to the above-mentioned products, but not limited thereto. In order to simplify the description, the display device is taken as an example of the electronic device for description in the following embodiments and variant embodiments, but the present disclosure is not limited thereto. As shown in FIG. 1, the display device 100 includes a display panel DP, and the display panel DP may include a display region DR and a non-display region PR, wherein the display region DR may be the region of the display device 100 for displaying the images, and the non-display region PR is the region of the display device 100 outside the display region DR, which may for example be called as the peripheral region. The non-display region PR may for example be used to dispose peripheral wires and/or peripheral circuits such as driving elements or wires, but not limited thereto. In some embodiments, the display panel DP may include the display region DP only. In the present embodiment, the display region DR may be defined by a plurality of pixels (or sub-pixels, which will be called as a pixel in the following) of the display device 100. In detail, the display region DR of the present embodiment may for example be a pixel region PXR, wherein the pixel region PXR may include a plurality of pixels or sub-pixels to display images, but not limited thereto. It should be noted that the pixels in the pixel region PXR may for example include pixels of a single color or pixels of a plurality of colors, but not limited thereto. For example, the pixel region PXR may include the pixels generating one of red lights, blue lights, green lights or lights of other suitable colors in some embodiments, or the pixel region PXR may include the pixels generating red lights, blue lights and green lights in some embodiments, but not limited thereto. The definition of the pixels in the pixel region PXR mentioned above may be applied to each of the embodiments and variant embodiments of the present disclosure, and will not be redundantly described in the following.

Figure 2:
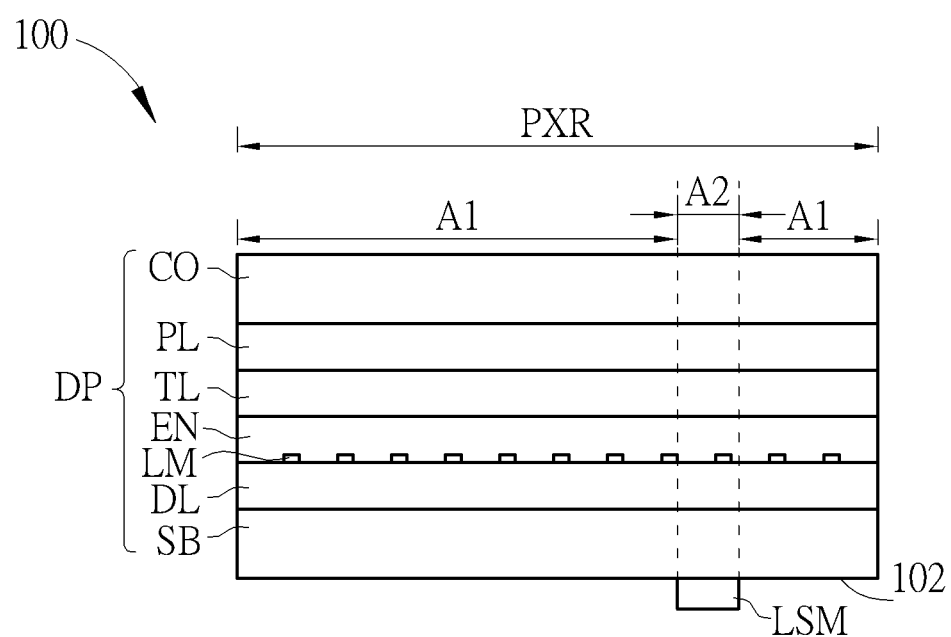
FIG. 2 schematically illustrates a cross-sectional view of the electronic device according to the first embodiment of the present disclosure.

Referring to FIG. 2 as well as FIG. 1, FIG. 2 schematically illustrates a cross-sectional view of the electronic device according to the first embodiment of the present disclosure. In order to simplify the figure, the portion of the display device 100 in the non-display region PR is not shown in FIG. 2, but not limited thereto. As shown in FIG. 2, the display panel DP of the display device 100 may be the display panel mentioned in each of the embodiments and variant embodiments of the present disclosure, and will not be redundantly described in the following. The display panel DP may include a substrate SB, a driving layer DL, light emitting elements LM and an insulating layer EN. The substrate SB may for example be a flexible substrate or a non-flexible substrate. The material of the substrate SB may for example include glass, ceramic, quartz, sapphire, acrylic, polyimide (PI), polyethylene terephthalate (PET), polycarbonate (PC), polyethersulfone (PES), polybutylene terephthalate (PBT), polyethylene naphthalate (PEN), polyarylate (PAR), other suitable materials or the combinations of the above-mentioned materials, but not limited thereto. The driving layer DL is disposed on the substrate SB, wherein the driving layer DL may include at least one driving element, and the driving element may for example include a thin film transistor, other suitable driving elements or the combinations of the above-mentioned elements. The thin film transistor may for example be a top-gate thin film transistor, a bottom-gate thin film transistor, a dual-gate thin film transistor or a multi-gate thin film transistor, but not limited thereto. The light emitting elements LM are disposed on the driving layer DL and are electrically connected to the corresponding driving element of the driving layer DL, such that the driving element may drive the light emitting elements LM to emit lights and display images, but not limited thereto. In some embodiments, the light emitting elements LM may be disposed on the substrate SB, and the driving signal may be provided by an external circuit board to drive the light emitting elements LM to emit lights and display images. According to the present embodiment, the light emitting elements LM may for example include organic light emitting diode (OLED), quantum dot light emitting diode (QLED or QDLED), light emitting diode (LED), mini light emitting diode (mini LED), micro light emitting diode (micro LED), other types of light emitting diode or the combinations of the above-mentioned light emitting diodes, but not limited thereto. For example, the light emitting elements LM of the present embodiment may be light emitting diode elements, and each of the light emitting elements LM may for example include a top electrode, a bottom electrode and a light emitting layer disposed between the top electrode and the bottom electrode (not shown in figures), but not limited thereto. In some embodiments, each of the light emitting elements LM may be disposed on two different electrodes, and the two different electrodes may for example be the electrodes with different current flow. In detail, the light emitting element LM may be disposed on an anode and a cathode, wherein the current of the anode flows to the light emitting element LM, and the current of the cathode flows out of the light emitting element LM, but not limited thereto. The insulating layer EN may be disposed on the light emitting elements LM to protect the light emitting elements LM, wherein the insulating layer EN may include any suitable insulating material. In some embodiments, the insulating layer EN may be an encapsulation layer, and the insulating layer EN may be disposed on the light emitting elements LM and cover the light emitting elements LM and the layers thereunder. In addition to the above-mentioned elements or layers, the display panel DP may optionally include a touch layer TL, a polarizer PL and a cover layer CO. The touch layer TL is disposed on the encapsulation layer (insulating layer EN), and the touch layer TL may for example include touch elements such as touch electrodes and wires, but not limited thereto. In some embodiments, the touch layer TL may be disposed on the light emitting elements LM or the top electrodes of the light emitting elements LM. The polarizer PL may be disposed on the touch layer TL, and the polarizer may for example provide optical functions such as polarization. The cover layer CO may be disposed on the polarizer PL to protect the elements and layers of the display panel DP, wherein the cover layer CO may include cover glass, other suitable covering materials or the combinations of the above-mentioned materials, but not limited thereto. It should be noted that the disposition of the elements or the layers of the display panel DP of the present embodiment is not limited to what is shown in FIG. 2, and the disposition order of the elements or the layers may be adjusted according to the demands. In addition, the display panel DP may further include other suitable elements or layers in some embodiments, and the present disclosure is not limited thereto.

According to the present embodiment, the display device 100 may further include an optical sensing module LSM in addition to the display panel DP. For example, as shown in FIG. 1 and FIG. 2, the display region DR (or the pixel region PXR) of the display panel DP of the display device 100 may include a first area A1 and a second area A2, wherein the optical sensing module LSM may be disposed on a bottom surface 102 of the substrate SB corresponding to the second area A2. In some embodiments, the optical sensing module LSM is disposed corresponding to the second area A2, and at least a portion of the optical sensing module LSM is disposed on the bottom surface 102 of the substrate SB. The optical sensing module LSM may for example include optical sensor, optical distance sensor, optical fingerprint sensor or other suitable optical sensing elements, but not limited thereto. It should be noted that although the second area A2 is rectangular in FIG. 1, the present disclosure is not limited thereto. In some embodiments, the second area A2 may be circular, oval-shaped, non-regular or other suitable shapes according to the demands of the design. The definitions and other features of the first area A1 and the second area A2 will be detailed in the following.

Figure 3:
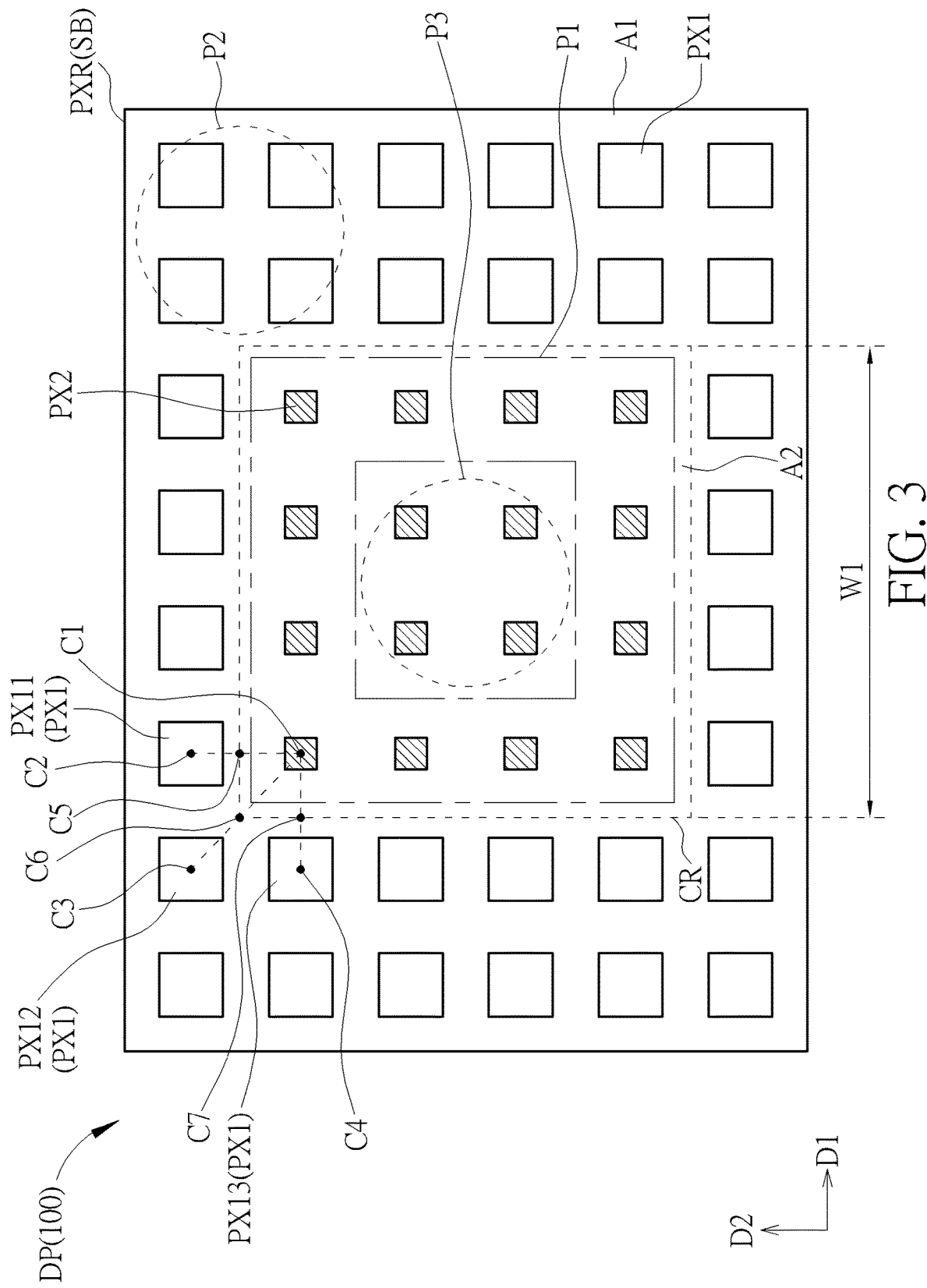
FIG. 3 schematically illustrates the distribution of pixels of the electronic device according to the first embodiment of the present disclosure.

Referring to FIG. 3 as well as FIG. 2, FIG. 3 schematically illustrates the distribution of pixels of the electronic device according to the first embodiment of the present disclosure. In order to simplify the figure, FIG. 3 only shows the distribution of the pixels in a portion of the pixel region PXR, and other elements or layers may be referred to in FIG. 2 and are omitted, but not limited thereto. In addition, in the embodiment shown in FIG. 3, the condition that the pixel region PXR includes the pixels emitting lights of a single color is taken as an example, but the present disclosure is not limited thereto. According to the present embodiment, the pixel region PXR of the display panel DP may include the pixels with different designs. In detail, as shown in FIG. 3, the pixel region PXR may include pixels PX1 and pixels PX2 in the present embodiment, wherein the pixels PX1 and the pixels PX2 may be the pixels of the display panel DP having display function, but not limited thereto. It should be noted that the "pixel" mentioned above may for example formed of each of the light emitting element LM shown in FIG. 2 and the driving elements and/or other layers corresponding to the light emitting element LM. That is, a pixel may for example include a light emitting element LM and the driving elements and/or other layers corresponding to the light emitting element LM, but not limited thereto. The definition of the pixel mentioned in the present embodiment may be applied to each of the embodiments and variant embodiments of the present disclosure, and will not be redundantly described in the following. According to the present embodiment, the size of the pixel PX1 may be different from the size of the pixel PX2. In detail, the size of the pixel PX1 may be greater than the size of the pixel PX2, and the density of the pixel PX1 may be the same as the density of the pixel PX2, but not limited thereto. It should be noted that "the size of the pixel PX1 is greater than the size of the pixel PX2" mentioned above means that the area of the substrate SB covered by the pixel PX1 is greater than the area of the substrate SB covered by the pixel PX2, or, when the length of the pixel PX1 is greater than the length of the pixel PX2 in a first direction D1 and/or a second direction D2, the size of the pixel PX1 may also be regarded to be greater than the size of the pixel PX2, wherein the areas of the pixel PX1 and the pixel PX2 may for example be the areas of the light emitting layers (not shown in figure) of the light emitting elements LM of the pixel PX1 and the pixel PX2 respectively, and the lengths of the pixel PX1 and the pixel PX2 in the same direction may for example be the lengths of the light emitting layers (not shown in figure) of the light emitting elements LM of the pixel PX1 and the pixel PX2 respectively, but not limited thereto. In addition, the density of the pixel PX1 and the density of the pixel PX2 mentioned above may represent the number of the pixels PX1 in a unit area and the number of the pixels PX2 in a unit area respectively. In detail, since it can be seen from FIG. 3 that the number (or distribution density) of the pixels PX1 in a unit area and the number of the pixels PX2 in a unit area are substantially the same, the pixels PX1 and the pixels PX2 may be regarded to have substantially the same density in the present embodiment, but not limited thereto. The first direction D1 and the second direction D2 mentioned above may for example be the arrangement direction of the pixels PX1 and the pixels PX2 in the present embodiment, but not limited thereto. In some embodiments, when the pixels PX1 and the pixels PX2 are arranged along the lateral direction and the longitudinal direction, the first direction D1 (such as the lateral direction, but not limited thereto) and the second direction D2 (such as the longitudinal direction, but not limited thereto) may be perpendicular to each other, or, according to the arrangement of the pixels PX1 and the pixels PX2, the first direction D1 and the second direction D2 may not be perpendicular to each other in some embodiments, but not limited thereto. The definitions of the area, the length and the arrangement direction of the pixel mentioned above may be applied to each of the embodiments and variant embodiments of the present disclosure, and will not be redundantly described in the following. Because the pixels PX1 and the pixels PX2 include the same density and different sizes in the present embodiment, the region enclosed by the connections of the midpoints of the line segments connecting the center points of the outermost pixels PX2 and the center points of the pixels PX1 located at the periphery of the outermost pixels PX2 but adjacent to the outermost pixels PX2 may be defined as the second area A2 of the pixel region PXR after the pixels PX2 are defined through the size characteristic, and the region of the pixel region PXR other than the second area A2 may be defined as the first area A1, but not limited thereto. In detail, as shown in FIG. 3, because the pixels PX2 and the pixels PX1 have different sizes in the present embodiment, the pixels may be defined to be the pixel PX1 or the pixel PX2 through the size of the appearance of the pixels, and after all of the pixels are defined, all of the pixels PX2 may be determined, and the outermost portion of the pixels PX2 (such as the pixels PX2 in the ring-shaped portion P1 shown in FIG. 3) may be founded. After that, the midpoint of the line segment connecting the center point of each of the outermost pixels PX2 and the center point of the pixel PX1 adjacent to that outermost pixel PX2 may be defined, and the region enclosed by the connections of the defined midpoints may be defined as the second area A2. It should be noted that the center point of the pixel may be the center of the outline or the shape of the pixel, for example, when the outline of the pixel is circular or oval-shaped, the center point of the pixel may be the center of the circle or oval, or, when the outline of the pixel is triangular, rectangular or polygonal, the center point of the pixel may be the geometry center of the shape, or, when the outline or the shape of the pixel is irregular, the center point may be the center of the circle in which the circle is drawn by using the line segment connecting the two farthest points of the irregular shape as the diameter. For example, as shown in FIG. 3, one of the outermost pixels PX2 may have a center point C1, and the pixels PX1 (such as the pixel PX11, the pixel PX12 and the pixel PX13) adjacent to that outermost pixel PX2 may have a center point C2, a center point C3 and a center point C4 respectively, wherein the line segment connecting the center point C1 and the center point C2 may have a midpoint C5, the line segment connecting the center point C1 and the center point C3 may have a midpoint C6, and the line segment connecting the center point C1 and the center point C4 may have a midpoint C7. After other midpoints are defined through the above-mentioned methods, the region enclosed by the connections of the midpoint C5, the midpoint C6, the midpoint C7 and other midpoints may be defined as the second area A2, as shown in FIG. 3, but not limited thereto. The first area A1 and the second area A2 of the pixel region PXR may be defined through the above-mentioned method, wherein the pixels in the first area A1 are regarded as the pixels PX1, and the pixels in the second area A2 are regarded as the pixels PX2. According to the present disclosure, the transmittance of the second area A2 may be greater than the transmittance of the first area A1, and because some of the structures of the pixel may affect the transmittance, the pixels PX2 in the second area A2 may be designed to have a smaller size comparing to the pixels PX1 in the first area A1 in the present embodiment, such that the transmittance of the second area A2 is greater than the transmittance of the first area A1 can be achieved. The measurement of the transmittance mentioned above may for example be respectively performed on the portion P2 of the first area A1 and the portion P3 of the second area A2 by using a probe having a size of 1 millimeter (mm)*1 mm, 2 mm*2 mm, 5 mm*5 mm or 20 mm*20 mm, but not limited thereto. The "transmittance" mentioned in the present disclosure is the percentage of the light intensity measured after the light source penetrates the pixel region PXR divided by the light intensity measured when the light source does not penetrate the pixel region PXR. The light intensity mentioned in the present disclosure is the integral value of the spectrum of the light source (the light source may for example include displaying light or ambient light), and the light source may for example include visible light (for example, the light with a wavelength ranges from 380 nanometers (nm) to 780 nm) or infrared light (for example, the light with a wavelength ranges from 780 nm to 1000000 nm), but not limited thereto. For example, when the light source includes visible light, the light intensity may be the integral value of the spectrum from 380 nm to 780 nm, and the transmittance of the pixel region PXR is the percentage of the integral value of the spectrum of the visible light measured after the light source penetrates the pixel region PXR divided by the integral value of the spectrum of the visible light measured when the light source does not penetrate the pixel region PXR. It should be noted that the light source should penetrate the pixel region PXR in order to measure the transmittance of the pixel region PXR, for example, the transmittance from the substrate SB to the insulating layer EN may be measured, the transmittance from the substrate SB to the polarizer PL may be measured, transmittance from the substrate SB to the touch layer TL may be measured or transmittance from the substrate SB to the cover layer CO may be measured, but not limited thereto. In addition, the comparison of the transmittance of the first area A1 and the second area A2 may also be performed through an optical microscope in addition to comparing the transmittance of the first area A1 and the transmittance of the second area A2 by measuring the transmittances through the equipment having transmittance measurement function. When the light source of the optical microscope penetrates the pixel region PXR, if the transmittance of the second area A2 is greater than the transmittance of the first area A1, the luminous flux of the second area A2 may be greater than the luminous flux of the first area A1, and the brightness of the second area A2 may be greater than the brightness of the first area A1. Therefore, when the pixel region PXR is displayed on a photo or an image, the gray level of the second area A2 may be greater than the gray level of the first area A1. It should be noted that the measurement of the transmittance of the first area A1 and the transmittance of the second area A2 should be performed on similar stacks of layers and in the same way. For example, if the transmittance of the first area A1 is observed from the substrate SB to the cover layer CO by the optical microscope, the transmittance of the second area A2 should also be observed from the substrate SB to the cover layer CO by the optical microscope with the same light source, thereby comparing the transmittance of the first area A1 and the transmittance of the second area A2. The measurement of the transmittance of the embodiments or variant embodiments in the following may be referred to in the present embodiment, and will not be redundantly described in the following. As mentioned above, the display device 100 may include the optical sensing module LSM (as shown in FIG. 2) disposed on the bottom surface 102 of the substrate SB and corresponding to the second area A2. Because the transmittance of the second area A2 may be greater than the transmittance of the first area A1 in the present embodiment, when the optical sensing module LSM is disposed corresponding to the second area A2, the light receiving effect of the optical sensing module LSM through the second area A2 may be improved, and the sensing effect of the optical sensing module LSM may thereby be improved.

It should be noted that the second area A2 mentioned above may be composed of the pixels of a single color or the pixels of a plurality of colors. In detail, as mentioned above, the pixel region PXR of the present embodiment may include the pixels emitting lights of a single color or the pixels emitting lights of a plurality of colors, wherein the definition of the second area A2 is described in the above-mentioned contents and in FIG. 3 when the pixel region PXR includes the pixels emitting lights of a single color, and will not be redundantly described. When the pixel region PXR includes the pixels emitting lights of a plurality of colors, a region can be defined by the above-mentioned method in each type of the pixels, and the second area A2 may be formed of the defined regions. For example, the pixel region PXR may for example include red pixels, green pixels and blue pixels in some embodiments, and in order to define the range of the second area A2, the red pixels in the pixel region PXR may for example be determined, and the pixels PX1 and the pixels PX2 of the red pixels may be defined according to the above-mentioned method, thereby defining the second area of the red pixels. After that, the second area of the blue pixels and the second area of the green pixels are defined in the same way, and the second area A2 of the pixel region PXR may for example be the union (union area) of the second area of the red pixels, the second area of the blue pixels and the second area of the green pixels, or in other words, the second area A2 of the pixel region PXR may cover at least one of the second area of the red pixels, the second area of the blue pixels and the second area of the green pixels, but not limited thereto. It should be noted that the definition of the second area A2 of the present embodiment is not limited to the above-mentioned contents, and the second area A2 may be defined in different ways according to the design of the product. The above-mentioned defining method of the second area A2 when the pixel region PXR includes the pixels emitting lights of a plurality of colors may be applied to each of the embodiments and variant embodiments of the present disclosure, and will not be redundantly described in the following.

According to the present embodiment, after the second area A2 of the pixel region PXR is defined, the width of the second area A2 may be defined. In detail, as shown in FIG. 3, the second area A2 may have a coverage CR on the substrate SB, wherein the coverage CR may have a width W1 in the first direction D1. It should be noted that although the coverage CR of the second area A2 is a rectangle in FIG. 3, the present embodiment is not limited thereto. As mentioned above, the second area A2 may have different shapes due to different types of the pixels and/or different definitions of the pixels. Therefore, the coverage CR of the second area A2 may have any suitable shape. When the coverage CR of the second area A2 is non-rectangular (such as circular or irregular), the width W1 may for example be defined as the maximum width of the coverage CR in the first direction D1, but not limited thereto.

Figure 4:
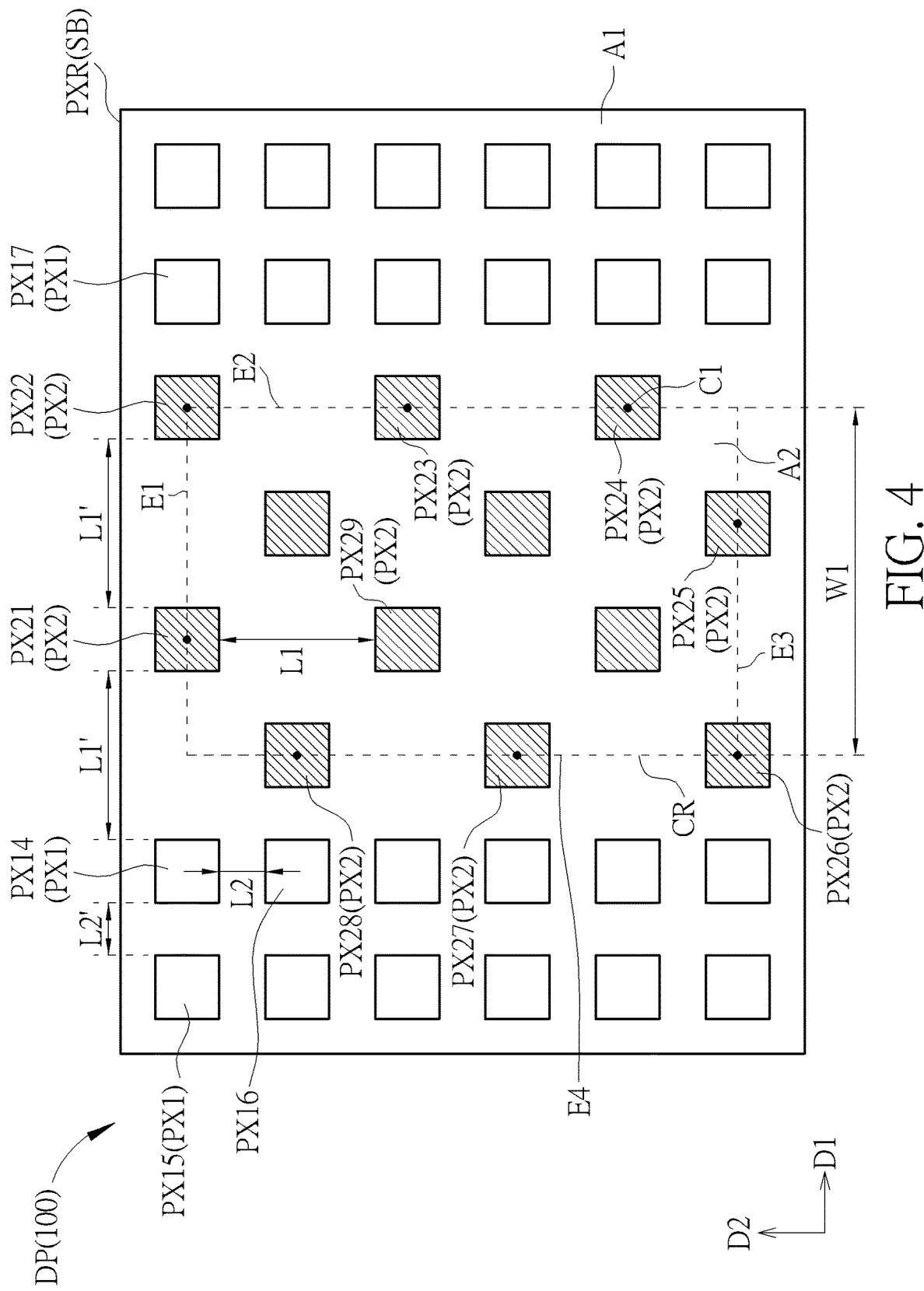
FIG. 4 schematically illustrates the distribution of pixels of an electronic device according to a variant embodiment of the first embodiment of the present disclosure.

Referring to FIG. 4 as well as FIG. 2, FIG. 4 schematically illustrates the distribution of pixels of an electronic device according to a variant embodiment of the first embodiment of the present disclosure. In order to simplify the figure, FIG. 4 only shows the distribution of the pixels of the pixel region PXR, and other elements or layers are omitted and may be referred to in FIG. 2, but not limited thereto. In addition, in the present variant embodiment shown in FIG. 4, the pixel region PXR includes the pixels emitting lights of a single color is taken as an example for description, but the present disclosure is not limited thereto. One of the main differences between the display panel shown in FIG. 4 and the display panel shown in FIG. 3 is the distribution of the pixels. As shown in FIG. 4, the pixel region PXR may include the pixels PX1 and the pixels PX2 in the present variant embodiment, wherein the size of the pixels PX1 and the size of the pixels PX2 are the same, but the density of the pixels PX2 may be less than the density of the pixels PX1, but not limited thereto. The definition of the size of the pixel and the density of the pixel may be referred to in the above-mentioned embodiments, and will not be redundantly described here. According to the present variant embodiment, because the pixels PX1 and the pixels PX2 have the same size and different densities, the region enclosed by the connections of the center points (such as the center point C1) of the outermost pixels PX2 along the arrangement directions of the pixels may be defined as the second area A2 after the pixels PX2 are defined through the density characteristic, and the region of the pixel region PXR other than the second area A2 may be defined as the first area A1, but not limited thereto. In some embodiments, the difference in the density characteristic may represent that the number of the pixels in a row (the first direction D1) is different from the number of the pixels in another row, or the number of the pixels in a column (the second direction D2) is different from the number of the pixels in another column under a constant length or width. For example, as shown in FIG. 4, six pixels are included in the second column from the left (that is, the column where the pixel PX14 is located), three pixels are included in the third column from the left (that is, the column where the pixel PX28 is located), and the density characteristic of the two columns mentioned above may be regarded to be different. In detail, as shown in FIG. 4, because the density of the pixels PX2 is lower, a greater spacing (such as the spacing L1 and the spacing L1' shown in FIG. 4) may be included between adjacent pixels PX2. In addition, because the pixels PX1 have relatively greater density, a lower spacing (such as the spacing L2 and the spacing L2' shown in FIG. 4) may be included between adjacent pixels PX1. According to the present variant embodiment, when the pixel to be defined and the pixels adjacent to the pixel to be defined include at least one spacing L1' in the first direction D1 and at least one spacing L1 in the second direction D2 respectively, the pixel to be defined may be defined as the pixel PX2, and the other pixels may be defined as the pixels PX1. For example, as shown in FIG. 4, the pixel PX21 and the two pixels adjacent to the pixel PX21 in the first direction D1 (the pixel PX14 and the pixel PX22) may all have the spacing L1', and the pixel PX21 and the pixel adjacent to the pixel PX21 in the second direction D2 (the pixel PX29) may have the spacing L1. Because the pixel PX21 and the pixels adjacent to the pixel PX21 include at least one spacing L1' in the first direction D1 and at least one spacing L1 in the second direction D2 respectively, the pixel PX21 may be defined as the pixel PX2 in the present variant embodiment. The spacing between the pixel PX22 and the pixel PX21 is the spacing L1', and the spacing between the pixel PX22 and the pixel PX17 is the spacing L2' in the first direction D1. In addition, the spacing between the pixel PX22 and the pixel adjacent to the pixel PX22 (the pixel PX23) is the spacing L1. Therefore, because the pixel PX22 and the pixels adjacent to the pixel PX22 include at least one spacing L1' in the first direction D1 and at least one spacing L1 in the second direction D2 respectively, the pixel PX22 may be defined as the pixel PX2 in the present variant embodiment. In another aspect, as shown in FIG. 4, the spacing between the pixel PX14 and the pixel PX21 in the first direction D1 is the spacing L1', and the spacing between the pixel PX14 and the pixel PX15 in the first direction D1 is the spacing L2'. In addition, the spacing between the pixel PX14 and the pixel PX16 in the second direction D2 is the spacing L2. Therefore, because the pixel PX14 and the pixels adjacent to the pixel PX14 only include the spacing L1' in the first direction, the pixel PX14 may be defined as the pixel PX1 in the present variant embodiment. The definitions of the first direction D1 and the second direction D2 may be referred to in the above-mentioned contents, and will not be redundantly described here. It should be noted that the first direction D1 and the second direction D2 shown in FIG. 4 are the lateral direction and the longitudinal direction respectively is only an example, and the first direction and the second direction may be any suitable direction in some embodiments according to the arrangement condition of the pixels. The pixels in the pixel region PXR may be divided into the pixels PX1 and the pixels PX2 through the above-mentioned method, and after the type of the pixels is defined, the region enclosed by the connections of the center points (such as the center point C1) of the outermost pixels PX2 in the arrangement direction (such as the first direction D1 and the second direction D2) of the pixels can be defined as the second area A2. In detail, as shown in FIG. 4, the outermost pixels PX2 shown in FIG. 4 may be the pixel PX2*l* to the pixel PX28, wherein the center point of the pixel PX2*l* and the center point of the pixel PX22 may include a connection E1 in the first direction D1, the center point of the pixel PX22, the center point of the pixel PX23 and the center point of the pixel PX24 may include a connection E2 in the second direction D2, the center point of the pixel PX25 and the center point of the pixel PX26 may include a connection E3 in the first direction D1, the center point of the pixel PX26, the center point of the pixel PX27 and the center point of the pixel PX28 may include a connection E4 in the second direction D2, and the region enclosed by the connection E1, the connection E2, the connection E3 and the connection E4 may be defined as the second area A2 in the present variant embodiment, but not limited thereto. Similarly, although the pixel region PXR shown in FIG. 4 includes the pixels emitting lights of a single color, the present disclosure is not limited thereto. In some embodiments, the pixel region PXR may include the pixels emitting lights of a plurality of colors, and the definition of the second area A2 of the pixel region PXR under this condition may be referred to in the defining methods of the present variant embodiment and the above-mentioned embodiment. That is, the second area of the pixels of each of the colors may be defined respectively, and the union region of the defined second areas of the pixels of each of the colors may be defined, which will not be redundantly described here. The first area A1 and the second area A2 of the pixel region PXR may be defined through the above-mentioned methods, wherein the pixels in the first area A1 may be the pixels PX1, and the pixels in the second area A2 may be the pixels PX2. According to the present disclosure, the transmittance of the second area A2 may be greater than the transmittance of the first area A1, and because some of the structures of the pixel may affect the transmittance, the pixels PX2 in the second area A2 may be designed to have a lower density comparing to the pixels PX1 in the first area A1 in the present embodiment, such that the transmittance of the second area A2 is greater than the transmittance of the first area A1 can be achieved. The measurement of the transmittance of the present variant embodiment may refer to the above-mentioned embodiment, and will not be redundantly described here. As mentioned above, the display device 100 may include the optical sensing module LSM (as shown in FIG. 2) disposed on the bottom surface 102 of the substrate SB and corresponding to the second area A2. Because the transmittance of the second area A2 may be greater than the transmittance of the first area A1 in the present embodiment, when the optical sensing module LSM is disposed corresponding to the second area A2, the light receiving effect of the optical sensing module LSM through the second area A2 may be improved, and the sensing effect of the optical sensing module LSM may thereby be improved.

According to the present variant embodiment, after the first area A1 and the second area A2 of the pixel region PXR are defined, the width of the second area A2 may be defined. In detail, as shown in FIG. 4, the second area A2 may have a coverage CR on the substrate SB, wherein the coverage CR may have a width W1 in the first direction D1, but not limited thereto. In some embodiments, when the coverage CR of the second area A2 includes irregular shapes due to different types of the pixels and/or different definitions of the pixels, the width of the coverage CR may for example be defined as the maximum width of the coverage CR in the first direction D1, but not limited thereto.

Figure 5:
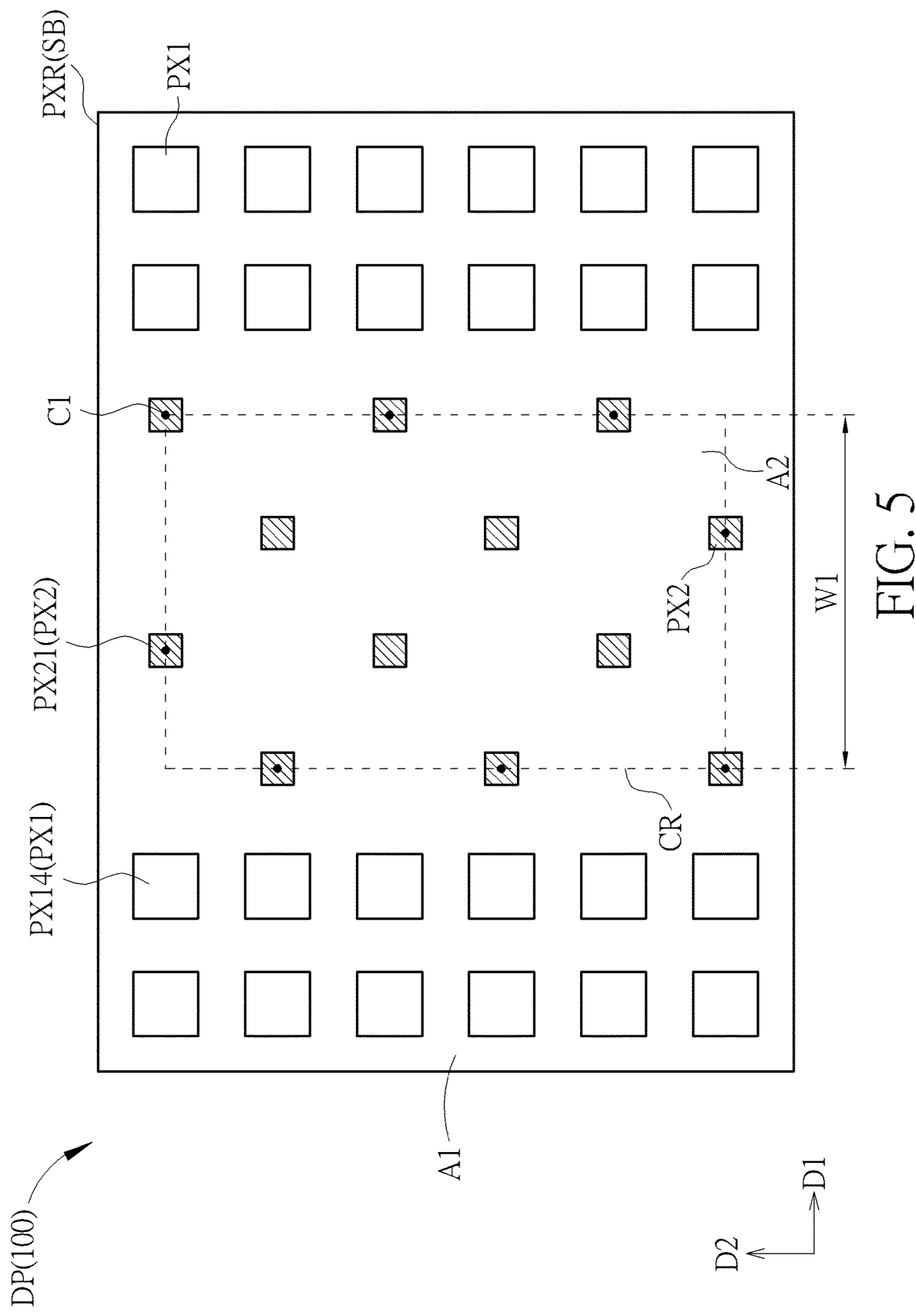
FIG. 5 schematically illustrates the distribution of pixels of an electronic device according to another variant embodiment of the first embodiment of the present disclosure.
Figure 6:
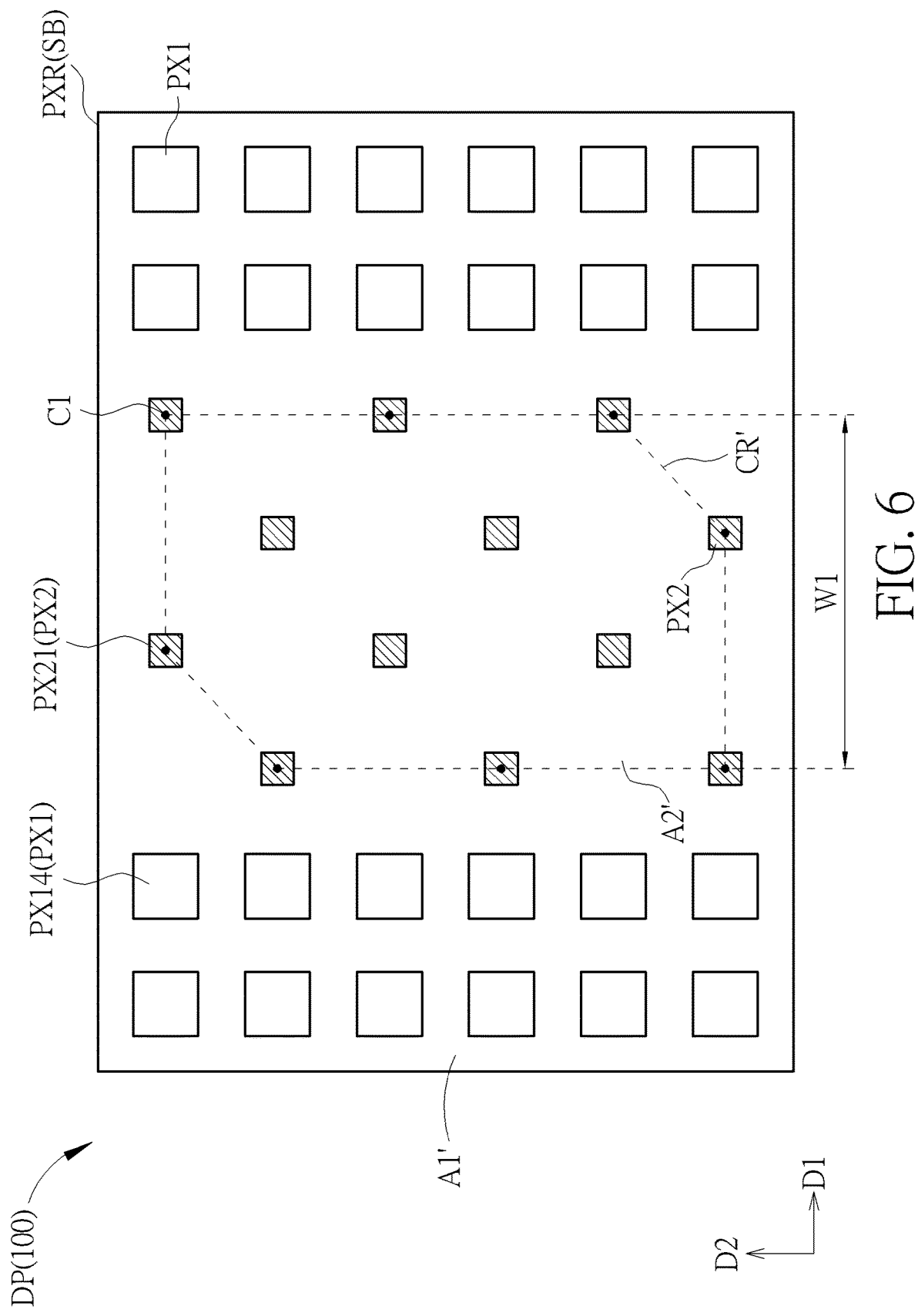
FIG. 6 schematically illustrates the distribution of pixels of an electronic device according to yet another variant embodiment of the first embodiment of the present disclosure.

Referring to FIG. 5 and FIG. 6, FIG. 5 schematically illustrates the distribution of pixels of an electronic device according to another variant embodiment of the first embodiment of the present disclosure, and FIG. 6 schematically illustrates the distribution of pixels of an electronic device according to yet another variant embodiment of the first embodiment of the present disclosure. In order to simplify the figures, FIG. 5 and FIG. 6 only show the distribution of the pixels of the display panel DP, and other elements or layers are omitted and may refer to FIG. 2, but not limited thereto. In addition, FIG. 5 and FIG. 6 show the condition that the display panel DP includes the pixels emitting lights of a single color, but the present disclosure is not limited thereto. One of the main differences between the display panels shown in FIG. 5 and FIG. 6 and the display panel shown in FIG. 3 is the distribution of the pixels. As shown in FIG. 5, the pixel region PXR may include the pixels PX1 and the pixels PX2, wherein the size and the density of the pixels PX2 are less than the size and the density of the pixels PX1. Because the size and the density of the pixels PX2 are different from the size and the density of the pixels PX1, the type of each of the pixels may be defined through the size characteristic and/or the density characteristic, wherein the defining method may be referred to in the above-mentioned embodiment and variant embodiment, and will not be redundantly described here. After the pixels PX1 and the pixels PX2 are defined, the method described in the above-mentioned variant embodiment shown in FIG. 4 may be used to define the first area A1 including the pixels PX1 and the second area A2 including the pixels PX2, wherein the defined second area A2 may have a coverage CR, and the coverage CR may have a width W1 in the first direction D1, but not limited thereto. In some embodiments, as shown in FIG. 6, after the pixels PX1 and the pixels PX2 are defined, when two adjacent pixels do not belong to the same type of the pixels, for example, when one of the adjacent two of the pixels is the pixel PX1 (such as the pixel PX14), and another one of the adjacent two of the pixels is the pixel PX2 (such as the pixel PX21), the connections of the center points of the outermost pixels PX2 may serve as the edges of the second area A2'. The "outermost" pixels PX2 may be the pixels PX2 in the uppermost row or the lowermost row in the second direction D2 and the pixels PX2 in the leftmost column or the rightmost column in the first direction D1. For example, the pixel PX2*l* is the outermost pixel PX2 (because the pixel PX2*l* is in the uppermost row in the second direction). The edges of the second area A2' are formed of the connections of the center points of the outermost pixels PX2. The second area A2' includes the pixels PX2, and the first area A1' includes the pixels PX1, wherein the second area A2' has a coverage CR', and the coverage CR' has a maximum width W1 in the first direction D1, but not limited thereto. In some embodiments, the pixel region PXR may include the pixels emitting lights of a plurality of colors, and the definition of the second area A2 (or the second area A2') of the pixel region PXR under this condition may refer to the defining methods of the present variant embodiment and the above-mentioned embodiment. That is, the second area of the pixels of each of the colors may be defined respectively, and the union region of the defined second areas of the pixels of each of the colors may be defined, which will not be redundantly described here. According to the present variant embodiment, because the size and the density of the pixels PX2 in the second area A2 (or the second area A2') are less than the size and the density of the pixels PX1 in the first area A1 (or the first area A1'), the transmittance of the second area A2 (or the second area A2') may be greater than the transmittance of the first area A1 (or the second area A1'). The measurement of the transmittance may be referred to in the above-mentioned embodiment, and will not be redundantly described here. In addition, as mentioned above, the display device 100 may include the optical sensing module LSM (as shown in FIG. 2) disposed on the bottom surface 102 of the substrate SB and corresponding to the second area A2 (or the second area A2'). Because the transmittance of the second area A2 (or the second area A2') may be greater than the transmittance of the first area A1 (or the first area A1') in the present embodiment, when the optical sensing module LSM is disposed corresponding to the second area A2 (or the second area A2'), the light receiving effect of the optical sensing module LSM through the second area A2 (or the second area A2') may be improved, and the sensing effect of the optical sensing module LSM may thereby be improved.

Figure 7:
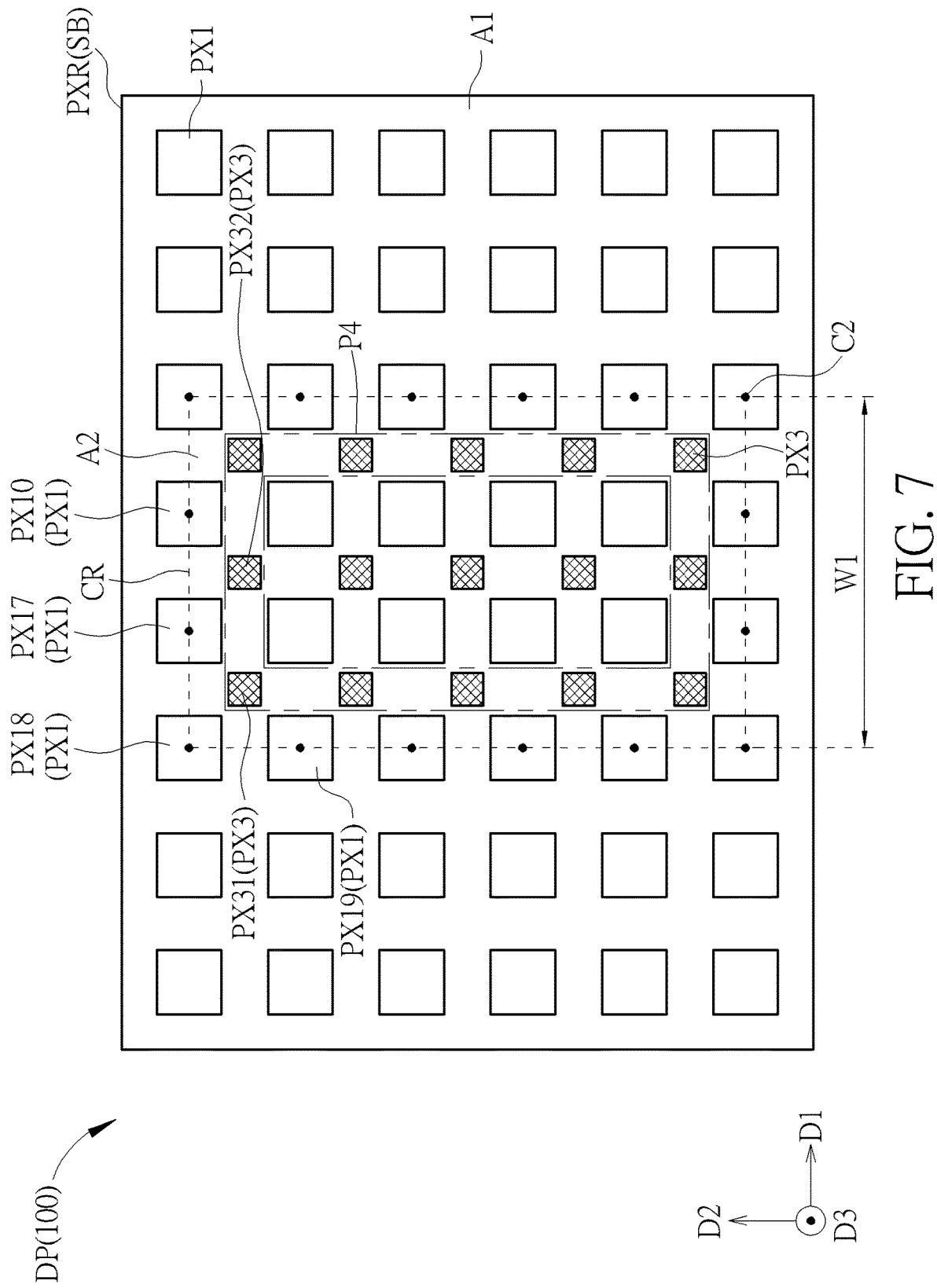
FIG. 7 schematically illustrates the distribution of pixels of an electronic device according to a second embodiment of the present disclosure.

Referring to FIG. 7, FIG. 7 schematically illustrates the distribution of pixels of an electronic device according to a second embodiment of the present disclosure. In order to simplify the figure, FIG. 7 only shows the distribution of the pixels of the display panel DP, and other elements or layers are omitted and may refer to FIG. 2, but not limited thereto. In addition, FIG. 7 show the condition that the display panel DP includes the pixels emitting lights of a single color, but the present disclosure is not limited thereto. One of the main differences between the display panel shown in FIG. 7 and the display panel shown in FIG. 3 is the design of the pixels. According to the present embodiment, the display panel DP may not include the pixel PX2 mentioned in the above-mentioned embodiments and variant embodiments. However, the display panel DP may further include adjusting pixels disposed in the pixel region PXR. In detail, as shown in FIG. 7, the pixel region PXR of the display panel DP of the present embodiment may include the pixels PX1 and the adjusting pixels PX3, but not limited thereto. The pixels PX1 of the present embodiment may be similar to or the same as the pixels PX1 of the above-mentioned embodiments and variant embodiments, and will not be redundantly described here. According to the present embodiment, the adjusting pixels PX3 may be disposed in the pixel region PXR, for example, the adjusting pixels PX3 shown in FIG. 7 may be disposed staggered with the pixels PX1, and the adjusting pixels PX3 are not overlapped with the pixels PX1 in the first direction D1 and the second direction D2 (that is, the arrangement direction of the pixels), but not limited thereto. In some embodiments, the disposition position of the adjusting pixels PX3 may be adjusted according to the demands of the design as long as the adjusting pixels PX3 are not overlapped with the pixels PX1 in a third direction D3 perpendicular to the display surface of the display panel DP (such as the normal direction of the display surface of the display panel DP, but not limited thereto). In addition, as shown in FIG. 7, the density of the adjusting pixels PX3 and the density of the pixels PX1 may be the same, and the size of the adjusting pixels PX3 may be less than the size of the pixels PX1, but not limited thereto. In some embodiments, according to the demands of the design, the density and the size of the adjusting pixels PX3 may be greater than, equal to or less than the density and the size of the pixels PX1. According to the present embodiment, the adjusting pixels PX3 may be used to adjust the transmittance of the pixel region PXR, wherein the adjusting pixels PX3 may for example be achieved by disposing a liquid crystal layer in the display device (such as the display device 100 shown in FIG. 1 and FIG. 2). In detail, the liquid crystal layer and the driving elements of the liquid crystal layer may be disposed at any suitable position of the display device, such that each of the adjusting pixels PX3 may correspond to a single liquid crystal unit, but not limited thereto. In some embodiments, the adjusting pixels PX3 may be formed by the design of the substrate of the display device. For example, the patterned holes or recesses may be formed on the bottom surface 102 of the substrate SB of the display device 100 shown in FIG. 2, wherein the position of the holes or the recesses may for example correspond to the position of the adjusting pixels PX3, but not limited thereto. It should be noted that the adjusting pixels PX3 formed through the above-mentioned methods may increase the transmittance of the display panel DP. For example, when the adjusting pixels PX3 are formed by disposing the liquid crystal layer and the driving elements, because the adjusting pixels PX3 may correspond to the liquid crystal units in the liquid crystal layer, the transmittance of a portion of the pixel region PXR including the adjusting pixels PX3 may be improved by the increasing light penetration due to turning of the liquid crystal units driven by the driving elements. Or, when the adjusting pixels PX3 are formed by forming holes on the bottom surface 102 of the substrate SB, because a portion of the substrate SB corresponding to the adjusting pixels PX3 has lower thickness due to the holes or the recesses, the transmittance of the portion of the pixel region PXR including the adjusting pixels PX3 may be improved by reducing the thickness of the substrate SB, but not limited thereto. It should be noted that the adjusting pixels PX3 are formed by disposing the liquid crystal layer and/or reducing the thickness of the substrate SB in the present embodiment, thereby adjusting the transmittance. Therefore, compared to the pixels PX1 and the pixels PX2 mentioned above, the adjusting pixels PX3 of the present embodiment may not have display function, but not limited thereto.

Referring to FIG. 7 again, the first area A1 and the second area A2 of the pixel region PXR may be defined by the positions of the adjusting pixels PX3 and the pixels PX1 in the present embodiment. In detail, after the adjusting pixels PX3 are formed, the positions of all of the adjusting pixels PX3 can be defined. After that, the outermost adjusting pixels PX3 may be determined, and the region enclosed by the connections of the center points (such as the center point C2) of the pixels PX1 located at the periphery of the outermost adjusting pixels PX3 and adjacent to the outermost adjusting pixels PX3 may be defined as the second area A2, and the region of the pixel region PXR other than the second area A2 may be defined as the first area A1, wherein the positions of the adjusting pixels PX3 may for example be determined when the adjusting pixels PX3 are formed, but not limited thereto. For example, as shown in FIG. 7, after the positions of all of the adjusting pixels PX3 are defined, the outermost adjusting pixels PX3 (such as the adjusting pixels PX3 in the ring-shaped portion P4 shown in FIG. 7) may be determined, and with respect to each of the outermost adjusting pixels PX3, the pixel PX1 located at the periphery of that adjusting pixel PX3 and adjacent to that adjusting pixel PX3 may be defined. For example, as shown in FIG. 7, the pixels PX1 located at the periphery of the adjusting pixel PX31 and adjacent to the adjusting pixel PX31 include the pixel PX17, the pixel PX18 and the pixel PX19, and the pixels PX1 located at the periphery of the adjusting pixel PX32 and adjacent to the adjusting pixel PX32 include the pixel PX17 and the pixel PX10, but not limited thereto. After all of the pixels PX1 meet the above-mentioned conditions are determined, the region enclosed by the connections of the center points (such as the center point C2) of these pixels PX1 may be defined as the second area A2 of the pixel region PXR, and the other region of the pixel region PXR may be defined as the first area A1, but not limited thereto. It should be noted that the defining method of the first area A1 and the second area A2 of the present embodiment is not limited to the above-mentioned contents, and the first area A1 and the second area A2 may be defined in different ways according to the demands of the design. The pixel region PXR may be divided into the first area A1 and the second area A2 through the above-mentioned method, wherein the second area A2 may include the adjusting pixels PX3. As mentioned above, the display device 100 may include the optical sensing module LSM (as shown in FIG. 2) disposed on the bottom surface 102 of the substrate SB and corresponding to the second area A2. Because the second area A2 may include the adjusting pixels PX3 in the present embodiment to improve the transmittance of the second area A2, the light receiving effect of the optical sensing module LSM through the second area A2 may be improved, thereby improving the sensing effect of the optical sensing module LSM.

According to the present embodiment, after the first area A1 and the second area A2 of the pixel region PXR are defined, the width of the second area A2 may be defined. In detail, as shown in FIG. 7, the second area A2 may have a coverage CR, wherein the coverage CR may have a width W1 in the first direction D1, but not limited thereto. In some embodiments, when the coverage CR of the second area A2 includes irregular shapes due to different types of the pixels and/or different definitions of the second area A2, the width of the coverage CR may be defined as the maximum width of the coverage CR in the first direction D1, but not limited thereto.

Figure 8:
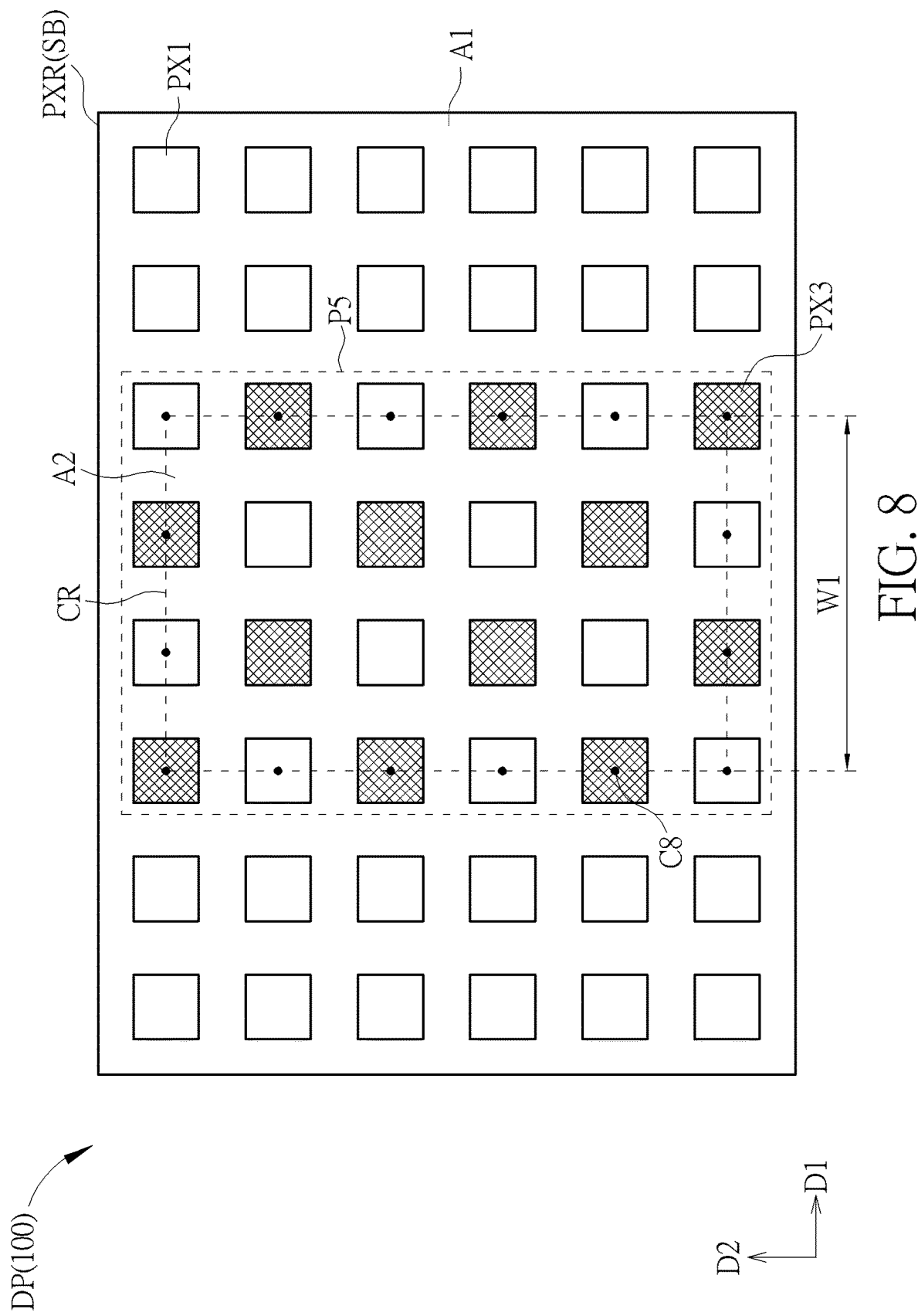
FIG. 8 schematically illustrates the distribution of pixels of an electronic device according to a variant embodiment of the second embodiment of the present disclosure.

Referring to FIG. 8, FIG. 8 schematically illustrates the distribution of pixels of an electronic device according to a variant embodiment of the second embodiment of the present disclosure. In order to simplify the figure, FIG. 8 only shows the distribution of the pixels of the display panel DP, and other elements or layers are omitted and may refer to FIG. 2, but not limited thereto. In addition, FIG. 8 show the condition that the display panel DP includes the pixels emitting lights of a single color, but the present disclosure is not limited thereto. One of the main differences between the display panel shown in FIG. 8 and the display panel shown in FIG. 7 is the distribution of the adjusting pixels. According to the present variant embodiment, as shown in FIG. 8, the adjusting pixels PX3 may be disposed in the pixel region PXR, wherein the adjusting pixels PX3 may replace a portion of the pixels PX1, such that the adjusting pixels PX3 and the pixels PX1 may be alternately arranged along the first direction D1 and the second direction D2 (that is, the arrangement direction of the pixels) in a certain portion (such as the portion P5 shown in FIG. 8) of the pixel region, but the present disclosure is not limited thereto. The forming method of the adjusting pixels PX3 of the present variant embodiment may be the same as the forming method of the above-mentioned embodiment, and will not be redundantly described here. Because the disposition positions of the adjusting pixels PX3 of the present variant embodiment may be similar to the disposition positions of the pixels PX2 shown in FIG. 4, the defining method mentioned in the variant embodiment shown in FIG. 4 may be used, that is, the region enclosed by the connections of the center points (such as the center point C8) of the outermost adjusting pixels PX3 along the first direction D1 and the second direction D2 may be defined as the second area A2, and the region of the pixel region PXR other than the second area A2 may be defined as the first area A1, as shown in FIG. 8, but not limited thereto. After the second area A2 of the pixel region PXR is defined, the width of the second area A2 may be defined. As shown in FIG. 8, the second area A2 may have a coverage CR, wherein the coverage CR may have a width W1 in the first direction D1, but not limited thereto. In some embodiments, when the coverage CR of the second area A2 includes irregular shapes due to different types of the pixels and/or different definitions of the second area A2, the width of the coverage CR may be defined as the maximum width of the coverage CR in the first direction D1, but not limited thereto. According to the present variant embodiment, because the second area A2 may include the adjusting pixels PX3, the transmittance of the second area A2 may be greater than the transmittance of the first area A1. In addition, as mentioned above, the display device 100 shown in FIG. 2 may include the optical sensing module LSM disposed on the bottom surface 102 of the substrate SB and corresponding to the second area A2. Because second area A2 can include the adjusting pixels PX3 to improve the transmittance thereof in the present variant embodiment, the light receiving effect of the optical sensing module LSM through the second area A2 may be improved, and the sensing effect of the optical sensing module LSM may thereby be improved.

Figure 9:
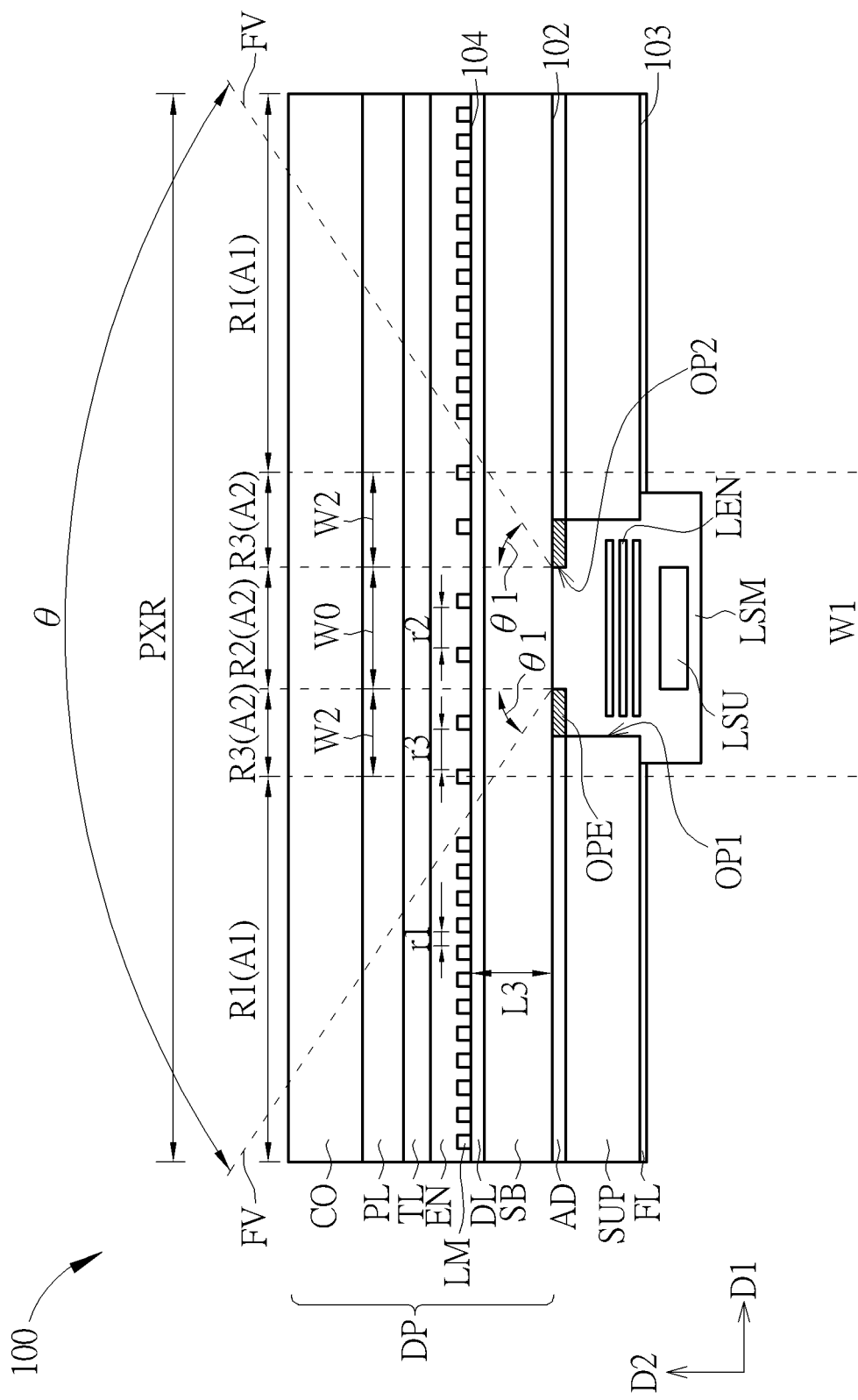
FIG. 9 schematically illustrates a cross-sectional view of an electronic device according to a third embodiment of the present disclosure.

Referring to FIG. 9, FIG. 9 schematically illustrates a cross-sectional view of an electronic device according to a third embodiment of the present disclosure. In order to simplify the figure, the non-display region of the display device is omitted in FIG. 9, but the present disclosure is not limited thereto. According to the present embodiment, as shown in FIG. 9, the display device 100 may include the display panel DP and the optical sensing module LSM, wherein the display panel DP shown in FIG. 9 and the elements or the layers included in the display panel DP may be the same or similar to the display panel DP shown in FIG. 2, and will not be redundantly described here. In the present embodiment, the optical sensing module LSM may be disposed on the surface of the substrate SB. In detail, as shown in FIG. 9, the display device 100 of the present embodiment may further include a supporting layer SUP and an adhesive layer AD. The supporting layer SUP may provide the supporting function in the display device 100, and the supporting layer SUP may for example include polyethylene terephthalate (PET), other suitable materials or the combinations of the above-mentioned materials, but not limited thereto. The adhesive layer AD may include any suitable adhesive material, and the supporting layer SUP may for example be adhered to the substrate SB of the display panel DP through the adhesive layer AD, but not limited thereto. In the present embodiment, an aperture OP1 may be formed in the supporting layer SUP and the adhesive layer AD to expose the bottom surface 102 of the substrate SB after the supporting layer SUP and the adhesive layer AD are disposed, and the optical sensing module LSM may be disposed in the aperture OP1, such that the optical sensing module LSM may be in contact with the bottom surface 102 of the substrate SB, thereby finishing the disposition of the optical sensing module LSM, but not limited thereto. In some embodiments, the optical sensing module LSM may not be in contact with the bottom surface 102 of the substrate SB. It should be noted that the feature mentioned in the present embodiment that the display device 100 includes the supporting layer SUP and the adhesive layer AD may be applied to each of the embodiments and variant embodiments of the present disclosure, that is, the display devices (such as the display device 100 shown in FIG. 2) of the embodiments and variant embodiments mentioned above may also include the supporting layer SUP and the adhesive layer AD, but not limited thereto.

The display device 100 of the present embodiment may further include a functional layer FL in addition to the above-mentioned elements or layers, wherein the functional layer FL may for example be disposed on the bottom surface 103 of the supporting layer SUP, but not limited thereto. According to the present embodiment, the functional layer FL may for example include heat dissipation layer, sensing layer (for example, the sensing board of stylus, but not limited thereto), other suitable layers or the combinations of the above-mentioned layers. When the display device 100 includes the functional layer FL, the disposition of the optical sensing module LSM may for example include forming the aperture OP1 in the adhesive layer AD, the supporting layer SUP and the functional layer FL and disposing the optical sensing module LSM in the aperture OP1, but not limited thereto. It should be noted that the feature of the present embodiment that the display device includes the functional layer FL may be applied in the display devices (such as the display device 100 shown in FIG. 2) of each of the embodiments and variant embodiments of the present disclosure.

Referring to FIG. 9 again, as shown in FIG. 9, the optical sensing module LSM of the present embodiment may for example be a camera, wherein the optical sensing module LSM may include common elements in the camera such as the light sensing unit LSU, the lens LEN, the aperture OPE and the like, but not limited thereto. According to the present embodiment, the optical sensing module LSM may include an aperture OP2, and because the optical sensing module LSM of the present embodiment may for example include camera, the aperture OP2 may for example be defined by the aperture OPE of the optical sensing module LSM. For example, according to the design of the aperture OPE (such as the F-number) of the optical sensing module LSM, the diameter of the aperture OP2 may be different, but not limited thereto. In the present embodiment, the optical sensing module LSM (camera) may include a field of view, and an angle of view may be defined. In detail, as shown in FIG. 9, the coverage of the field of view of the optical sensing module LSM may for example be defined by two dotted lines FV shown in FIG. 9 (actually, the dotted lines FV may be an enclosed pattern in the top view of the display device, thereby defining the coverage of the field of view of the optical sensing module LSM). That is, the region between the two dotted lines FV may for example be the coverage of the field of view of the optical sensing module LSM, wherein an included angle θ may be included in the field of view (as shown in FIG. 9) and is defined as the angle of view of the optical sensing module LSM, but not limited thereto. According to the aperture OP2 and the field of view of the optical sensing module LSM, a first portion R1, a second portion R2 and a third portion R3 of the pixel region PXR of the display device 100 of the present embodiment may be defined. In detail, as shown in FIG. 9, the first portion R1, the second portion R2 and the third portion R3 of the pixel region PXR may be defined based on the bottom surface (that is, the surface 104 shown in FIG. 9) of the light emitting elements LM, wherein the second portion R2 may correspond to the aperture OP2 of the optical sensing module LSM, the third portion R3 may include the region on the surface 104 located within the coverage of the field of view other than the second portion R2, and the first portion R1 may include the region of the pixel region PXR other than the second portion R2 and the third portion R3, but not limited thereto. It should be noted that the "bottom surface of the light emitting elements LM" mentioned above may for example be the bottom surface of the bottom electrode (such as the anode) of the light emitting elements LM, but not limited thereto. In some embodiments, the aperture OP2 corresponding to the second portion R2 may be the aperture corresponding to the minimum F-number of the optical sensing module LSM, in other words, the aperture OP2 corresponding to second portion R2 may include the maximum aperture size. According to the present embodiment, because the optical sensing module LSM of the display device 100 may be a camera, the second portion R2 corresponding to the aperture OP2 of the optical sensing module LSM may for example include the region of vertical projection of the lens of the camera, and the third portion R3 located within the field of view of the optical sensing module LSM may for example be the light receiving region of the camera in addition to the second portion R2, but not limited thereto.

According to the present embodiment, the optical sensing module LSM may receive the lights through the aperture OP2, such that the lights may enter the light sensing unit LSU through the lens LEN to form images. For example, as shown in FIG. 9, because the second portion R2 and the third portion R3 are within the range of the field of view of the optical sensing module LSM in the present embodiment, the lights passing through the second portion R2 and the third portion R3 may enter the light sensing unit LSU of the optical sensing module LSM through the aperture OP2 of the optical sensing module LSM, but not limited thereto. It should be noted that from the above-mentioned embodiments and variant embodiments (as shown in FIG. 3 to FIG. 8), it can be seen that the optical sensing module LSM can be disposed corresponding to the second area A2 of the pixel region PXR, such that the optical sensing module LSM may receive the lights passing through the second area A2, in addition, because the optical sensing module LSM may be disposed corresponding to the second portion R2 and the third portion R3 in the present embodiment, such that the optical sensing module LSM may receive the lights passing through the second portion R2 and the third portion R3, the sum of the coverage of the second portion R2 and the coverage of the third portion R3 may substantially correspond to the coverage CR of the second area A2 mentioned in the above-mentioned embodiments and variant embodiments. In detail, as shown in FIG. 9, the sum of the coverage of the second portion R2 and the coverage of the third portion R3 may be the coverage CR of the second area A2 shown in FIG. 3 to FIG. 8, and the first portion R1 may substantially correspond to the first area A1 shown in FIG. 3 to FIG. 8, but not limited thereto. "The sum of the coverage of the second portion R2 and the coverage of the third portion R3 may substantially correspond to the coverage CR of the second area A2" mentioned above may represent that the sum of the coverage of the second portion R2 and the coverage of the third portion R3 may substantially be the same as the coverage CR of the second area A2 of the above-mentioned embodiments and variant embodiments, and although the sum of the coverage of the second portion R2 and the coverage of the third portion R3 may be slightly different from the coverage CR due to different optical sensing modules LSM, the differences may be ignored. As mentioned above, the sum of the second portion R2 and the third portion R3 of the present embodiment may be the same as the second area A2 of the above-mentioned embodiments and variant embodiments. Therefore, in the following contents of the present embodiment, the second portion R2 and the third portion R3 will be combined and called as the second area A2, wherein the second area A2 of the present embodiment may be referred to as the second area A2 shown in FIG. 3 to FIG. 8, and will not be redundantly described here. In other words, the optical sensing module LSM of the display device 100 of the present embodiment may include the aperture OP2, wherein the aperture OP2 may receive the lights passing through the second area A2, but not limited thereto. In addition, the third portion R3 and the second portion R2 of the second area A2 may respectively include a width in the present embodiment. In detail, as shown in FIG. 9, the second portion R2 may include a width W0 on the surface 104 of the display device 100 in the first direction D1, and the third portion R3 may include a width W2 on the surface 104 of the display device 100 in the first direction D1. It should be noted that the second portion R2 may for example be circular, and the third portion R3 may for example be ring-shaped in the present embodiment, wherein the width W0 mentioned above may be the diameter of the second portion R2, and the width W2 mentioned above may be the width of the ring of the third portion R3, but not limited thereto. According to the above-mentioned embodiments and variant embodiments, the second area A2 includes a coverage CR, wherein the coverage CR has a width W1 in the first direction D1, and because the second area A2 (including the second portion R2 and the third portion R3) of the present embodiment may be the same as the second area A2 of the above-mentioned embodiments and variant embodiments, the second area A2 of the present embodiment may also include a coverage (not shown) having the same width W1 in the first direction D1 as the coverage CR of the second area A2 shown in FIG. 3 to FIG. 8. That is, as shown in FIG. 9, the width W1 may be equal to the sum of the width W0 and two times of the width W2 (that is, W1=W0+2*W2), but not limited thereto. The definition of the width W1 of the present embodiment may be referred to in the definition of the width W1 of the above-mentioned embodiments and variant embodiments, and will not be redundantly described here. It can be known from the above-mentioned equation that the width (such as the width W0) of the aperture OP2 of the optical sensing module LSM may be less than the width (such as the width W1) of the coverage of the second area A2 in the present embodiment, but not limited thereto. The calculation methods and the ranges of the width W0 and the width W2 will be detailed in the following. In the present embodiment, the second direction D2 is substantially perpendicular to the bottom surface 102 of the substrate SB, and the first direction D1 is parallel to the arrangement direction of the light emitting elements LM in the cross-sectional view, but not limited thereto.

According to the present embodiment, the optical sensing module LSM of the display device 100 may for example be a camera. Therefore, the diameter of the aperture OP2 of the optical sensing module LSM may for example be equal to the diameter of the aperture OPE of the optical sensing module LSM, but not limited thereto. In addition, as mentioned above, the second portion R2 of the second area A2 of the present embodiment may correspond to the aperture OP2 of the optical sensing module LSM. Therefore, the width W0 of the second portion R2 may be equal to the size of the aperture OP2. In other words, the width W0 of the second portion R2 in the first direction D1 may be determined by the diameter of the aperture OPE of the optical sensing module LSM in the present embodiment, wherein the diameter of the aperture of the camera may be obtained through the formula (1) below.

$$\text{Diameter of aperture} = \frac{\text{focal length/crop factor}}{F-\text{number}} \quad (1)$$

The focal length in the formula (1) mentioned above may be defined as the distance between the optical center and the light sensing element of the camera. For example, the optical center of the camera may be the center of one of the lens LEN of the optical sensing module LSM shown in FIG. 9, and the light sensing element may for example be the light sensing unit LSU of the optical sensing module LSM, but not limited thereto. In some embodiments, the projection of the optical center on the width W1 may substantially be located at the midpoint of the width W1. In addition, according to the present embodiment, the focal length of the optical sensing module LSM may range from 10 mm to 45 mm (10 mm≤focal length≤45 mm), according to the demands of design of the optical sensing module LSM, but not limited thereto. The crop factor may be applied to the elements of the camera to establish the corresponding relationship of the focal length of different films under the same angle of view, thereby calculating the equivalent focal length of the camera. In the present embodiment, the crop factor may range from 4.55 to 10.81 (that is, 4.55≤crop factor≤10.81), according to the demands of design of the optical sensing module LSM, but not limited thereto. The F-number may represent the amount of lights entering the elements of the camera, wherein when the F-number is greater, the diameter of the aperture (such as the aperture OPE shown in FIG. 9) may be smaller, the amount of the lights entering the optical sensing module LSM may be reduced, and vice versa. According to the present embodiment, the F-number may range from 1 to 2.8 (that is, 1≤F-number≤2.8), according to the demands of design of the optical sensing module LSM, but not limited thereto. After the above-mentioned values are substituted into the formula (1), the diameter of the aperture OPE shown in FIG. 9 may be calculated, wherein when the focal length is 10 mm, the maximum diameter of the aperture may be 2.20 mm, and the minimum diameter of the aperture may be 0.33 mm; when the focal length is 45 mm, the maximum diameter of the aperture may be 9.89 mm, and the minimum diameter of the aperture may be 1.49 mm, but not limited thereto. In addition, because the width W0 of the second portion R2 in the first direction D1 may be equal to the diameter of the aperture OPE in the present embodiment, the range of the width W0 of the second portion R2 may refer to the range of the diameter of the aperture OPE mentioned above. That is, when the focal length is 10 mm, the width W0 may range from 0.33 mm to 2.20 mm (that is, 0.33 mm≤W0≤2.20 mm), and when the focal length is 45 mm, the width W0 may range from 1.49 mm to 9.89 mm (that is, 1.49 mm≤W0≤9.89 mm), but not limited thereto. It should be noted that the ranges of the values mentioned in the formula (1) are only exemplary, and the present disclosure is not limited thereto.

According to the present embodiment, as shown in FIG. 9, the width W2 of the third portion R3 of the second area A2 of the pixel region PXR in the first direction D1 may be obtained through the thickness L3 and the included angle θ1, wherein the relationship between the width W2, the thickness L3 and the included angle θ1 may be shown in formula (2) below.

$$\tan\theta 1 = \frac{\text{width } W2}{\text{thickness } L3} \quad (2)$$

The included angle θ1 may be varied according to different angles of view (such as the angle of view θ1 shown in FIG. 9). In detail, when the optical sensing module LSM includes different focal lengths, the angle of view (the included angle θ1 shown in FIG. 9) may be different. In addition, it can be seen from FIG. 9 that the value of the included angle θ1 is half of the value of the included angle θ1. Therefore, after the values of the angle of view under different focal lengths are confirmed, the value of the included angle θ1 may further be known. For example, when the focal length of the optical sensing module is 10 mm, the angle of view (the included angle θ1) may for example be 130.4 degrees, and the value of the included angle θ1 is half of the value of the included angle θ1, Therefore, the included angle θ1 may be 65.2 degrees when the focal length of the optical sensing module is 10 mm. Similarly, when the focal length of the optical sensing module is 45 mm, the angle of view (the included angle θ1) may for example be 51.4 degrees, and the value of the included angle θ1 is half of the value of the included angle θ, that is, 25.7 degrees, but not limited thereto. The thickness L3 of the present embodiment may for example be the sum of the thickness of the substrate SB and the thickness of the driving layer DL. In detail, as shown in FIG. 9, the thickness L3 may be the maximum distance between the bottom surface 102 of the substrate SB and the bottom surface (such as the surface 104 shown in FIG. 9) of the bottom electrode (such as the anode) of the light emitting elements LM in the second direction D2. Therefore, the types of the substrate SB and the thickness of the driving layer may affect the value of the thickness L3. In some embodiments, the thickness L3 may be the maximum thickness from the bottom surface of the light emitting elements to the aperture in the second direction D2. In some other embodiments, the thickness L3 may be the maximum thickness from the electrode of the light emitting elements to the aperture in the second direction D2. According to the present embodiment, the material of the substrate SB may for example include glass, ceramic, quartz, sapphire, acrylic, polyimide (PI), polyethylene terephthalate (PET), polycarbonate (PC), polyethersulfone (PES), polybutylene terephthalate (PBT), polyethylene naphthalate (PEN), polyarylate (PAR), other suitable materials or the combinations of the above-mentioned materials, but not limited thereto. The thickness of the polyimide substrate may for example be 7 micrometers (μm), and the thickness of the glass substrate may for example be 200 μm or 400 μm, but not limited thereto. In addition, the thickness of the driving layer DL may range from 7 μm to 10 μm, according to the demands of design, but not limited thereto. Therefore, after the above-mentioned values are substituted into the formula (2), the range of the width W2 may be obtained. In detail, when the focal length of the optical sensing module LSM is 10 mm, the maximum width W2 may be 0.88 mm, and the minimum width W2 may be 0.05 mm; when the focal length of the optical sensing module LSM is 45 mm, the maximum width W2 may be 0.195 mm, and the minimum width W2 may be 0.01 mm, but not limited thereto. It should be noted that the values of the included angle θ1 and the thickness L3 of the present embodiment are only exemplary, and the present disclosure is not limited thereto.

According to the present embodiment, after the range of the width W0 and the range of the width W2 are obtained, the range of the width W1 of the second area A2 may be further calculated. In detail, as mentioned above, because the value of the width W1 is equal to the value of the width W0 plus two times of the value of the width W2, when the focal length of the optical sensing module LSM is 10 mm, the maximum width W1 may be 3.96 mm, and the minimum width W1 may be 0.43 mm; when the focal length of the optical sensing module LSM is 45 mm, the maximum width W1 may be 10.28 mm, and the minimum width W1 may be 1.51 mm. That is, under the condition that different focal lengths (for example, 10 mm to 45 mm, but not limited thereto) of the optical sensing module LSM are satisfied, the width W1 of the coverage of the second area A2 in the first direction D1 is not greater than 10.28 mm and is not less than 0.43 mm (that is, 0.43 mm≤W1≤10.28 mm), but not limited thereto. In addition, as mentioned above, the width (width W0) of the aperture OP2 of the optical sensing module LSM may be less than the width (width W1) of the coverage of the second area A2 in the present embodiment, wherein the difference between the width W0 and the width W1 is two times of the width W2. Therefore, by calculating the range of the width W2, it can be known that the difference between the width W0 and the width W1 is not greater than 1.76 mm and not less than 0.02 mm (that is, 0.02 mm≤width difference≤1.76 mm), but not limited thereto. It should be noted that the range of the width W1 of the present embodiment may be applied to each of the embodiments and variant embodiments of the present disclosure. For example, the ranges of the widths W1 of the coverage CR of the second areas A2 shown in FIG. 3 to FIG. 8 may be the same as the range of the width W1 of the present embodiment, but not limited thereto.

In addition, as mentioned above, because the optical sensing module LSM of the present disclosure may be disposed corresponding to the second area A2, the pixels in the second area A2 may be further designed (for example, the pixels in the second area A2 may include smaller size and/or lower density, or the adjusting pixels may further be disposed in the second area A2), such that the transmittance of the second area A2 may be increased, thereby increasing the amount of lights entering the optical sensing module LSM. Because the second portion R2 and the third portion R3 may be located in the second area A2 in the present embodiment, the pixels in the second portion R2 and the third portion R3 may include different designs, which may refer to the above-mentioned embodiments and variant embodiment. As shown in FIG. 9, the densities of the pixels in the second portion R2 and the third portion R3 may for example be less than the density of the pixels in the first portion R1, and the density of the pixels in the second portion R2 may be the same as the density of the pixels in the third portion R3, but not limited thereto. In some embodiments, the density of the pixels in the first portion R1 may be the same as the density of the pixels in the third portion R3, and the density of the pixels in the first portion R1 is greater than the density of the pixels in the second portion R2. In some embodiments, the density of the pixels in the first portion R1 may be greater than the density of the pixels in the third portion R3, and the density of the pixels in the third portion R3 is greater than the density of the pixels in the second portion R2. In some embodiments, the pixels in the second portion R2 and the third portion R3 and the pixels in the first portion R1 may include the same density and different sizes. In some embodiments, the adjusting pixels may be disposed in the second portion R2 and the third portion R3. In some embodiments, the pixel densities of the first portion R1, the second portion R2 and the third portion R3 may be the ratios of the numbers of the pixels in the first portion R1, the second portion R2 and the third portion R3 to the corresponding areas of the first portion R1, the second portion R2 and the third portion R3 respectively. Therefore, if it is determined that the pixels in the first portion R1, the second portion R2 and the third portion R3 are arranged regularly in the first direction D1 and the second direction D2, the comparison of the pixel densities in two different portions may be performed by comparing the distances between adjacent two of the pixels in the two different portions in a cross-sectional view. When the density of the pixels in a portion is greater, the distance between adjacent two of the pixels in the portion may be lower. For example, as shown in FIG. 9, if the density of the pixels in the second portion R2 and the density of the pixels in the third portion R3 are to be compared, wherein the distance r2 is included between adjacent two of the pixels in the second portion R2, and the distance r3 is included between adjacent two of the pixels in the third portion R3, because the distance r2 is equal to the distance r3, the density of the pixels in the second portion R2 and the density of the pixels in the third portion R3 may be the same. If the density of the pixels in the first portion R1 and the density of the pixels in the second portion R2 are to be compared, wherein the distance r1 is included between adjacent two of the pixels in the first portion R1, and the distance r2 is included between adjacent two of the pixels in the second portion R2, because the distance r2 is greater than the distance r1, the density of the pixels in the second portion R2 may be less than the density of the pixels in the first portion R1, and vice versa.

Figure 10:
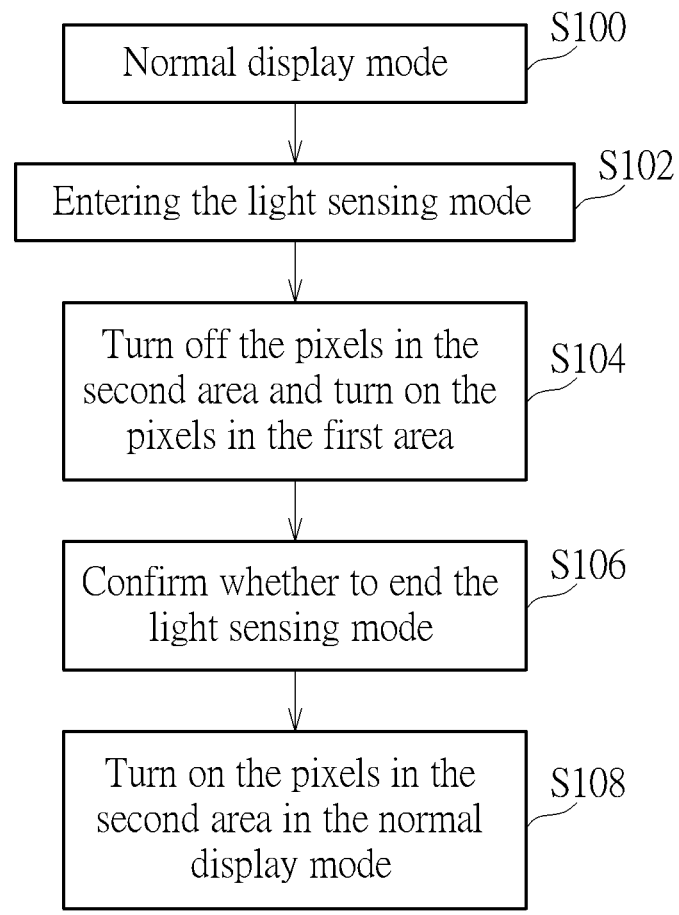
FIG. 10 schematically illustrates the driving process of the electronic device according to the first embodiment of the present disclosure.

Referring to FIG. 10, as well as FIG. 3 to FIG. 8, FIG. 10 schematically illustrates the driving process of the electronic device according to the first embodiment of the present disclosure. The driving process of the electronic device mentioned below may be applied to the embodiments and variant embodiments shown in FIG. 3 to FIG. 8, and the driving process may include the following steps.

S100: normal display mode. In normal display mode, the pixels in the first area A1 and the second area A2 may be driven by the driving layer DL to display images according to the demands of display. It should be noted that when the second area A2 of the display device 100 includes the adjusting pixels PX3, the adjusting pixels PX3 may not be turned on in the normal display mode, but not limited thereto. The "turn on" of the pixels mentioned here may represent that the pixels are changed from the "off" state to the "on" state, or the pixels in the "on" state are maintained in the same state, in addition, the "turn off" of the pixels may represent that the pixels are changed from the "on" state to the "off" state, or the pixels in the "off" state are maintained in the same state, but not limited thereto. The definitions of "turn on" and "turn off" of the pixels may be applied to the contents in the following, and will not be redundantly described.

S102: entering the light sensing mode. When the users want to use the functions of the optical sensing module LSM, the light sensing mode may be entered through specific programs of the electronic device (or the display device 100) or other suitable methods.

S104: turn off the pixels in the second area and turn on the pixels in the first area. When the users enter the light sensing mode, because the optical sensing module LSM is disposed corresponding to the second area A2, the pixels in the second area A2 may be optionally turned off to reduce the effect of lights on the sensing result, in addition, the pixels in the first area A1 may be turned on to perform normal display functions, but not limited thereto. In some embodiments, the pixels in the first area A1 may be optionally turned off in the light sensing mode.

S106: confirm whether to end the light sensing mode. After the users finish using the functions of the optical sensing module LSM, the light sensing mode can be ended in any suitable way.

S108: turn on the pixels in the second area in the normal display mode. After the light sensing mode is ended, the pixels in the second area A2 may be turned on to return to the normal display mode to display images. When the second area A2 of the display device 100 includes the adjusting pixels PX3, the adjusting pixels PX3 may optionally be turned off in the normal display mode, but not limited thereto.

Figure 11:
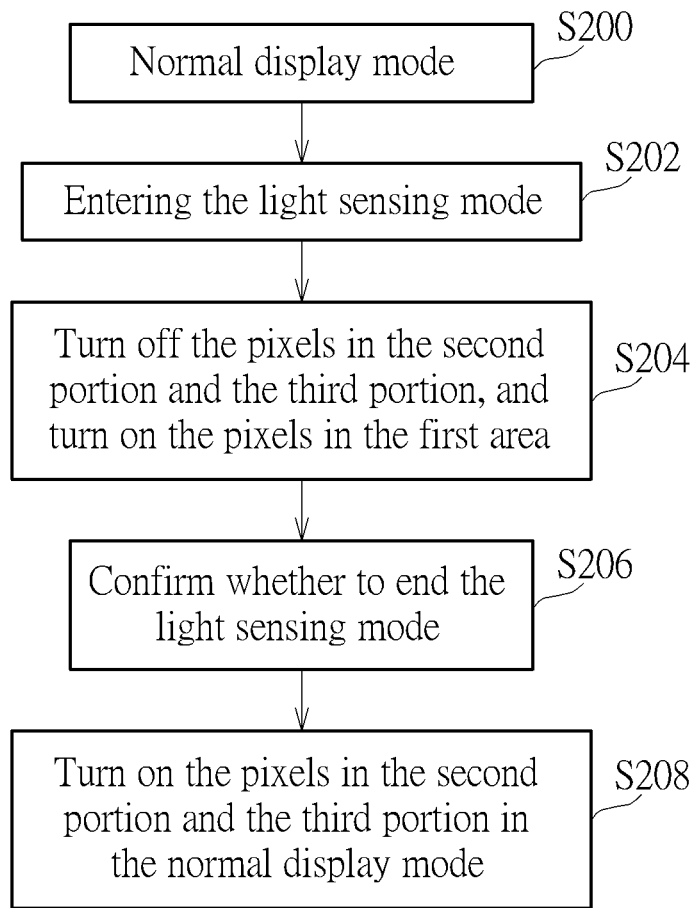
FIG. 11 schematically illustrates the driving process of the electronic device according to the third embodiment of the present disclosure.

Referring to FIG. 11, as well as FIG. 9, FIG. 11 schematically illustrates the driving process of the electronic device according to the third embodiment of the present disclosure. The driving process of the electronic device of the third embodiment of the present disclosure may include the following steps.

S200: normal display mode. In normal display mode, the pixels in the first portion R1, the second portion R2 and the third portion R3 may be driven by the driving layer DL to display images according to the demands of display. In addition, when the second portion R2 and/or the third portion R3 include the adjusting pixels PX3, the adjusting pixels PX3 may not be turned on in the normal display mode, but not limited thereto.

S202: entering the light sensing mode. When the users want to use the functions of the optical sensing module LSM, the light sensing mode may be entered through specific programs of the electronic device (or the display device 100) or other suitable methods.

S204: turn off the pixels in the second portion and the third portion, and turn on the pixels in the first area. When the users enter the light sensing mode, because the optical sensing module LSM is disposed corresponding to the second portion R2 and the third portion R3, the pixels in the second portion R2 and the third portion R3 may be optionally turned off to reduce the effect of lights on the sensing result, in addition, the pixels in the first portion R1 (the first area A1) may be turned on to perform normal display functions, but not limited thereto. In some embodiments, the pixels in the first portion R1 may be optionally turned off in the light sensing mode.

S206: confirm whether to end the light sensing mode. After the users finish using the functions of the optical sensing module LSM, the light sensing mode can be ended in any suitable way.

S208: turn on the pixels in the second portion and the third portion in the normal display mode. After the light sensing mode is ended, the pixels in the second portion R2 and the third portion R3 may be turned on to return to the normal display mode to display images. When the second portion R2 and/or the third portion R3 of the display device 100 include the adjusting pixels PX3, the adjusting pixels PX3 may optionally be turned off in the normal display mode, but not limited thereto.

In summary, an electronic device including an optical sensing module is provided by the present disclosure, wherein the pixel region of the electronic device may be divided into the first area and the second area, and the optical sensing module can be disposed corresponding to the second area. Because the pixels in the second area of the pixel region may include special designs such as the lower size or lower density, or the second area may include adjusting pixels, the transmittance of the second area may be greater than the transmittance of the first area. Therefore, the amount of the lights entering the optical sensing module disposed corresponding to the second area may be increased through the second area of the pixel region, thereby improving the performance of the optical sensing module.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
    a display panel, comprising:
        a pixel region which has a plurality of pixels and comprises:
            a first area; and
            a second area which is greater than the first area in a transmittance, wherein the second area includes a first portion and a second portion; and
        an optical sensing module disposed corresponding to the second area of the pixel region of the display panel and having an aperture being able to accept lights through the second area,
        wherein the second area has a coverage with a width of not less than 0.43 millimeter (mm), and a density of a portion of the plurality of pixels in the first portion is different from a density of another portion of the plurality of pixels in the second portion,
        wherein the aperture has a width, and the width of the aperture and the width of the coverage of the second area are in a difference of not less than 0.02 mm and not greater than 1.76 mm.

2. The display device as claimed in claim 1, wherein the width of the coverage of the second area is not greater than 10.28 mm.

3. The display device as claimed in claim 1, wherein the greater transmittance of the second area is made by a less density of the pixels in the second area in comparison with the first area.

4. The display device as claimed in claim 1, wherein the greater transmittance of the second area is made by a smaller size of the pixels in the second area in comparison with the first area.

5. The display device as claimed in claim 1, wherein the width of the aperture is less than the width of the coverage of the second area.

* * * * *